(12) United States Patent
Tsukuda et al.

(10) Patent No.: US 10,217,759 B2
(45) Date of Patent: Feb. 26, 2019

(54) SEMICONDUCTOR DEVICE

(71) Applicant: Renesas Electronics Corporation, Koutou-ku, Tokyo (JP)

(72) Inventors: Eiji Tsukuda, Tokyo (JP); Kenichiro Sonoda, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/669,595

(22) Filed: Aug. 4, 2017

(65) Prior Publication Data
US 2018/0097007 A1 Apr. 5, 2018

(30) Foreign Application Priority Data
Sep. 30, 2016 (JP) ................................. 2016-192552

(51) Int. Cl.
H01L 27/11568 (2017.01)
H01L 27/11565 (2017.01)
H01L 29/423 (2006.01)
H01L 29/78 (2006.01)
H01L 21/28 (2006.01)
H01L 29/66 (2006.01)
H01L 29/792 (2006.01)
H01L 27/1157 (2017.01)

(52) U.S. Cl.
CPC .. H01L 27/11568 (2013.01); H01L 21/28282 (2013.01); H01L 27/1157 (2013.01); H01L 27/11565 (2013.01); H01L 29/42344 (2013.01); H01L 29/66833 (2013.01); H01L 29/785 (2013.01); H01L 29/792 (2013.01)

(58) Field of Classification Search
CPC ............. H01L 29/792; H01L 21/28282; H01L 27/11568; H01L 29/66833; H01L 27/11521; H01L 29/4234; H01L 29/42344; H01L 29/42328
See application file for complete search history.

(56) References Cited

U.S. PATENT DOCUMENTS

| 7,504,689 B2 | 3/2009 | Hisamoto et al. | |
| 2006/0022260 A1* | 2/2006 | Hisamoto | H01L 21/28273 257/324 |
| 2011/0095348 A1* | 4/2011 | Chakihara | H01L 21/28273 257/298 |
| 2012/0132978 A1* | 5/2012 | Toba | H01L 21/28282 257/316 |
| 2013/0082315 A1* | 4/2013 | Hosoda | H01L 29/66833 257/315 |

FOREIGN PATENT DOCUMENTS

JP 2006-041354 A 2/2006

* cited by examiner

*Primary Examiner* — Frederick B Hargrove
(74) *Attorney, Agent, or Firm* — Shapiro, Gabor and Rosenberger, PLLC

(57) ABSTRACT

To provide a semiconductor device having improved reliability by preventing, in a split-gate MONOS memory comprised of a fin type transistor, unbalanced injection distribution of electrons into a charge accumulation film due to the shape of the fin. A memory gate electrode configuring a memory cell is formed over a fin. The impurity concentration of a portion of this memory gate electrode contiguous to an ONO film that covers the upper surface of the fin is made lower than that of a portion of the memory gate electrode contiguous to an ONO film that covers the side surface of the fin.

15 Claims, 18 Drawing Sheets

FIG. 32

| | OPERATION METHOD WRITE/ERASE | WRITE OPERATION VOLTAGE (V) Vmg/Vs/Vcg/Vd/Vb | ERASE OPERATION VOLTAGE (V) Vmg/Vs/Vcg/Vd/Vb | READ OPERATION VOLTAGE (V) Vmg/Vs/Vcg/Vd/Vb |
|---|---|---|---|---|
| A | SSI (WRITE)/ BTBT (ERASE) | 10/5/1/0.5/0 | -6/6/0/open/0 | 0/0/1.5/1.5/0 |
| B | SSI (WRITE)/ FN (ERASE) | 10/5/1/0.5/0 | 12/0/0/0/0 | 0/0/1.5/1.5/0 |

SEMICONDUCTOR DEVICE

CROSS-REFERENCE TO RELATED APPLICATIONS

The disclosure of Japanese Patent Application No. 2016-192552 filed on Sep. 30, 2016 including the specification, drawings, and abstract is incorporated herein by reference in its entirety.

BACKGROUND

The present invention relates to a semiconductor device, in particular, a technology effective when applied to a semiconductor device including a fin transistor.

A fin transistor is known as a field effect transistor which has a high operating rate, can be operated with a reduced leakage current at reduced energy consumption, and can be downsized. A fin transistor (FINFET: fin field effect transistor) is, for example, a semiconductor element having, as a channel layer, a plate-like (wall-like) semiconductor layer pattern protruding from a semiconductor substrate and having a gate electrode formed so as to stride over the pattern.

As an electrically programmable and erasable nonvolatile semiconductor memory device, EEPROM (electrically erasable and programmable read only memory) has been used widely. Such a memory device typified by a flash memory which is popularly used now has, below the gate electrode of its MISFET, a conductive floating gate electrode or trapping insulating film surrounded by an oxide film. It uses, as stored formation, a charge accumulation state in the floating gate or trapping insulating film and reads it out as the threshold of the transistor. This trapping insulating film means an insulating film in which charges can be accumulated and one example of it is a silicon nitride film. The flash memory is operated as a memory element by injecting or releasing charges into or from such a charge accumulation region and thereby shifting the threshold of the MISFET. Examples of this flash memory include a split-gate cell using a MONOS (metal-oxide-nitride-oxide-semiconductor) film.

Patent Document 1 (Japanese Unexamined Patent Application Publication No. 2006-041354 describes a split-gate MONOS memory comprised of a FINFET.

PATENT DOCUMENT

[Patent Document 1] Japanese Unexamined Patent Application Publication No. 2006-041354

SUMMARY

In a memory cell comprised of a FINFET, electric field concentration occurs easily in the vicinity of the upper surface of the fin because the semiconductor layer thereof has a peculiar shape, more specifically, it is plate-like and has a protrusion from a substrate (which may hereinafter be called "fin"). As a result, there appears a difference in MONOS memory write characteristics between the upper portion and the side surface portion of the fin, leading to reduction in write lifetime of the memory or deterioration in write characteristics of the memory.

Another object and novel features of the invention will be apparent from the description herein and accompanying drawings.

Of the embodiments disclosed by the present application, a typical one will next be outlined briefly.

In one embodiment of the invention, there is provided a semiconductor device having a MONOS memory comprised of a FINFET, in which the impurity concentration of a memory gate electrode, among memory gate electrodes configuring a memory cell, located above a fin is smaller than that of a memory gate electrode located below the upper surface of the fin.

In another embodiment of the invention, there is also provided a semiconductor device having a MONOS memory comprised of a FINFET in which immediately below a memory gate electrode configuring a memory cell, phosphorus is introduced into the upper surface of a fin adjacent to a source region configuring the memory cell.

The embodiments disclosed in the present application can provide a semiconductor device having improved reliability.

BRIEF DESCRIPTION OF THE DRAWINGS

FIG. 32 is a table for describing the operating voltage of a split-gate memory cell;

DETAILED DESCRIPTION

Figure 1:
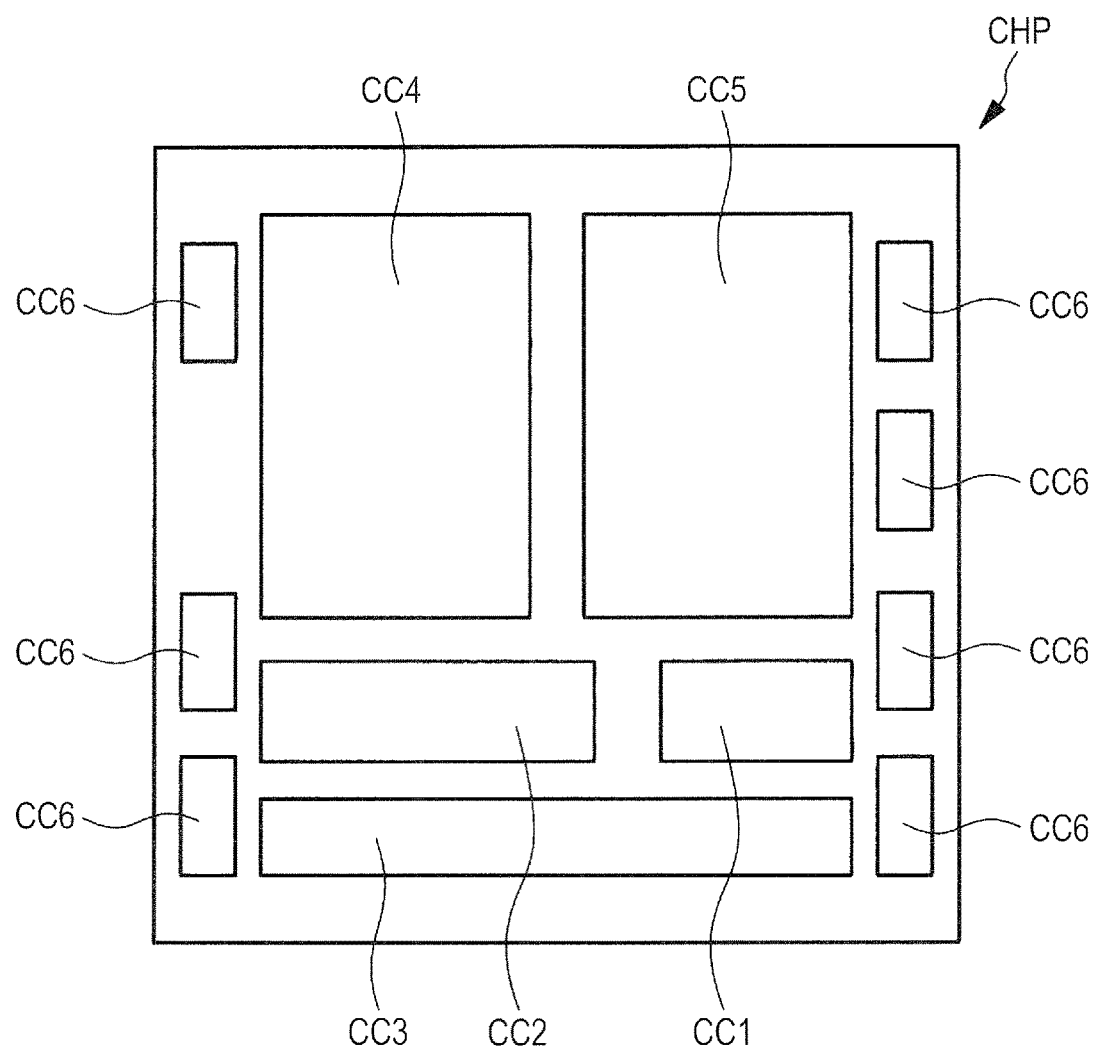
FIG. 1 is a schematic view showing the layout constitution of a semiconductor chip of First Embodiment of the invention.

In the following embodiments, a description will be made after divided into a plurality of sections or embodiments if necessary for the sake of convenience. These sections or embodiments are not independent from each other unless otherwise particularly specified, but one of them may be a modification example, details, a complementary description, or the like of a portion or the whole of the other one. In the following embodiments, when a reference is made to the number or the like (including the number, value, amount, range, or the like) of a component, the number is not limited to a specific number but may be more or less than the specific number, unless otherwise particularly specified or principally apparent that the number is limited to the specific number. Further, it is needless to say that in the following embodiments, the constituent component (including component step or the like) is not always essential unless otherwise particularly specified or principally apparent that it is essential. Similarly, in the following embodiments, when a reference is made to the shape, positional relationship, or the like of the constituent component, that substantially approximate or analogous to its shape or the like is also embraced unless otherwise particularly specified or principally apparent that it is not. This also applies to the above-described number and range.

The embodiments will hereinafter be described in detail based on some drawings. In all the drawings for describing the embodiments, members having the same function will be identified by the same reference numeral and overlapping descriptions will be omitted. In the following embodiments, a description on the same or similar portion is not repeated in principle unless otherwise particularly necessary.

(First Embodiment)
<Layout Constitution Example of Semiconductor Chip>

The semiconductor device having a nonvolatile memory according to the present embodiment will be described referring to some drawings. First, the layout constitution of a semiconductor device (semiconductor chip) having therein a system including a nonvolatile memory will be described. FIG. 1 is a schematic view showing the layout constitution example of a semiconductor chip CHP of the present embodiment. In FIG. 1, the semiconductor chip CHP has a CPU (central processing unit) CC1, a RAM (random access memory) CC2, and an analog circuit CC3. The semiconductor chip CHP further has an EEPROM (electrically erasable programmable read only memory) CC4, a flash memory CC5, and an I/O (input/output) circuit CC6. They configure a semiconductor device.

The CPU (circuit) CC1 is also called a central processing unit. It reads out and decodes instructions from a memory device and based on them, performs a variety of operations and controls.

The RAM (circuit) CC2 is a memory capable of reading out stored data at random, which means reading out stored data at any time, and capable of writing stored data newly. It is also called a random access memory. As the RAM, a SRAM (static RAM) using a static circuit is used.

The analog circuit CC3 is a circuit dealing with analog signals, that is, voltage and current signals which undergo a continuous time-dependent change. It is comprised of, for example, an amplifier circuit, a conversion circuit, a modulation circuit, an oscillator circuit, and a power supply circuit.

The EEPROM CC4 and the flash memory CC5 belong to a nonvolatile memory capable of electrically rewriting stored date in both write operation and erase operation. It is also called an electrically erasable programmable read only memory. The memory cell of this EEPROM CC4 and flash memory CC5 is comprised of a transistor for memory such as MONOS (metal oxide nitride oxide semiconductor) transistor or MNOS (metal nitride oxide semiconductor) transistor. A difference between the EEPROM CC4 and the flash memory CC5 is that the EEPROM CC4 is, for example, a nonvolatile memory permitting erasure by byte, while the flash memory CC5 is, for example, a nonvolatile memory permitting erasure by word line. In general, the flash memory CC5 stores therein a program for performing a variety of processing in the CPU CC1. On the other hand, the EEPROM CC4 stores therein a variety of data having high rewrite frequency. The EEPROM CC4 or flash memory CC5 has a memory cell array in which a plurality of nonvolatile memory cells are arranged in matrix form and has, in addition, an address buffer, a row decoder, a column decoder, a verify sense amplifier circuit, a sense amplifier circuit, a write circuit, and the like.

The I/O circuit CC6 is an input/output circuit and is a circuit for outputting data from the semiconductor chip CHP to an apparatus coupled to the outside of the semiconductor chip CHP or inputting data from an apparatus coupled to the outside of the semiconductor chip CHP to the semiconductor chip.

The semiconductor device of the present embodiment has a memory cell region and a logic circuit region. The memory cell region has a memory cell array in which a plurality of nonvolatile memory cells is arranged in matrix form. The logic circuit region has an address buffer, a row decoder, a column decoder, a verify sense amplifier circuit, a sense amplifier circuit, or a write circuit of the CPU CC1, the RAM CC2, the analog circuit CC3, the I/O circuit CC6, and the EEPROM CC4 or the flash memory CC5.

<Structure of Semiconductor Device>

Figure 2:
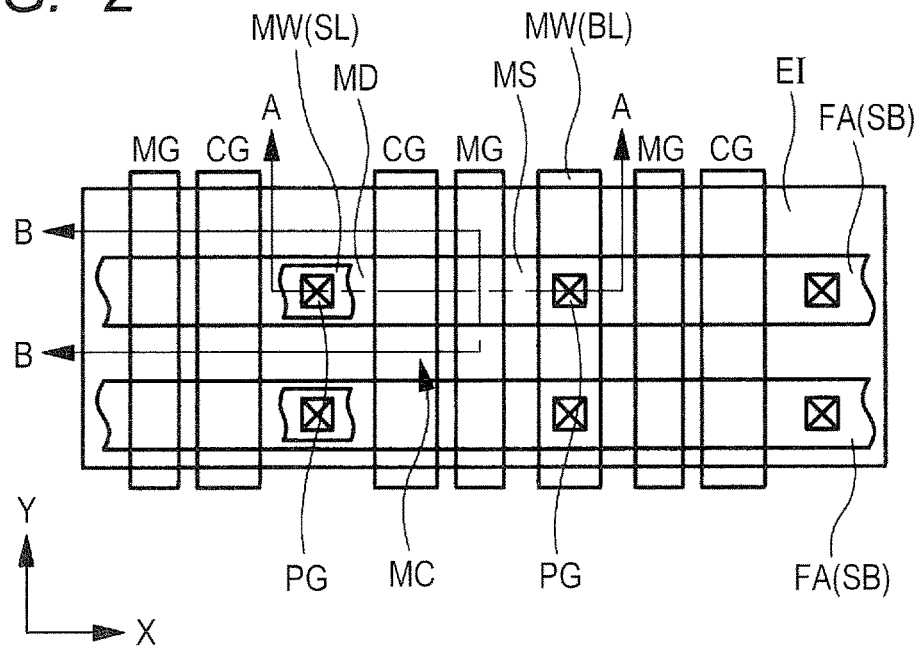
FIG. 2 is a plan view showing a semiconductor device of First Embodiment of the invention.
Figure 3:
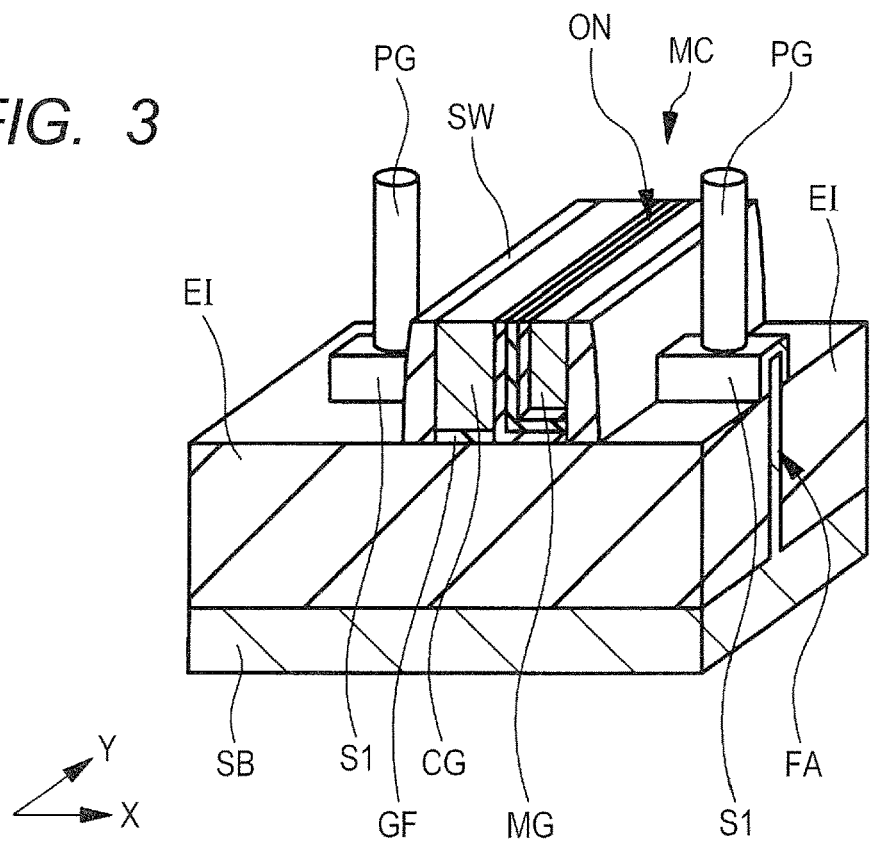
FIG. 3 is a perspective view showing the semiconductor device of First Embodiment of the invention.
Figure 4:
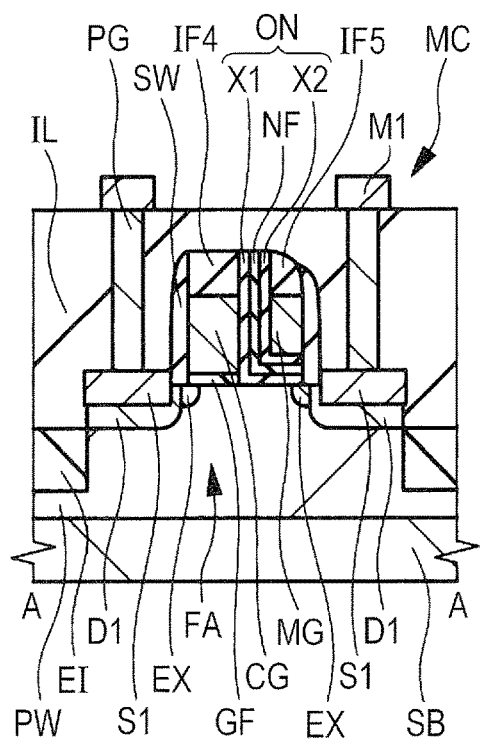
FIG. 4 is a cross-sectional view taken along the line A-A of FIG. 2.
Figure 5:
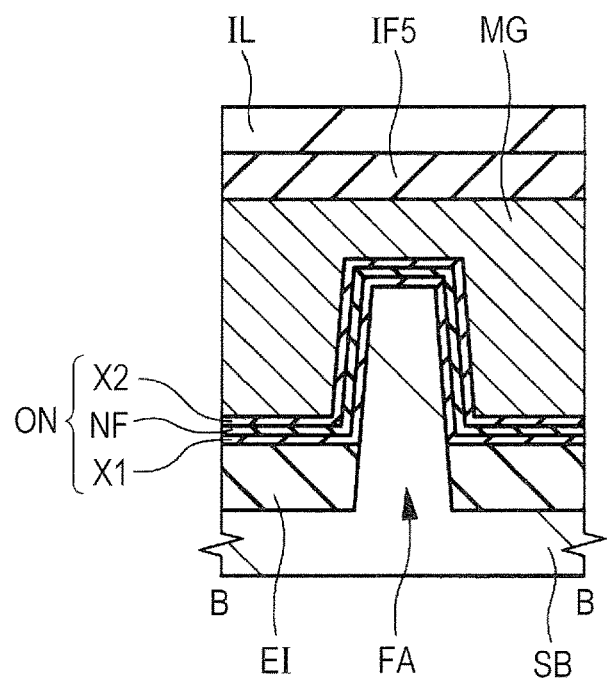
FIG. 5 is a cross-sectional view taken along the line B-B of FIG. 2.

The structure of the semiconductor device of the present embodiment will hereinafter be described referring to FIGS. 2 to 5. FIG. 2 is a plan view of the semiconductor device of the present embodiment. FIG. 3 is a perspective view of the semiconductor device of the present embodiment. FIGS. 4 and 5 are cross-sectional views of the semiconductor device of the present embodiment. A well is however omitted from FIGS. 4 and 5.

The plan view of a memory cell array is shown in FIG. 2. For example, the flash memory CC5 shown in FIG. 1 has therein a plurality of memory cells MC to be formed in the memory cell array. A region having a memory cell therein will hereinafter be called "memory cell region".

In the memory cell region, a plurality of fins FA extending in a direction X are arranged at equal intervals in a direction Y. The directions X and Y are directions along the main surface of a semiconductor substrate SB and the direction X is orthogonal to the direction Y. The fin FA is a cuboidal protruding portion (convex portion). It is protruded selectively from the main surface of the semiconductor substrate SB and has a wall-like (plate-like) shape. The fin FA is a portion of the semiconductor substrate SB and is an active region of the semiconductor substrate SB. In plan view, two fins FA adjacent to each other are filled therebetween with an element isolation film EI and the fin FA is surrounded with the element isolation film EI. The fin FA is an active region for forming therein the memory cell MC. The semiconductor substrate SB is made of p type single crystal silicon having a specific resistance of, for example, from about 1 to 10 Ωcm.

The fin FA is, at the lower end portion thereof, surrounded, in plan view, with the element isolation film EI that covers the main surface of the semiconductor substrate SB. A portion of the fin FA however protrudes from above the element isolation film EI. This means that all the regions between the fins adjacent to each other are not always filled with the element isolation film EI.

The plurality of fins FA has thereover a plurality of control gate electrodes CG and a plurality of memory gate electrodes MG extending in the direction Y. The fins FA have, in the upper surface thereof, a drain region MD on the side of the control gate electrode CG and a source region MS on the side of the memory gate electrode so as to sandwich the control gate electrode CG and the memory gate electrode MG. This means that one of the control gate electrodes CG and one of the memory gate electrodes MG adjacent to each other in the direction X are present between the source region MS and the drain region MD.

The drain region MD and the source region MS are each an n type semiconductor region. The drain region MD lies between two control gate electrodes CG adjacent to each other in the direction X and the source region MS lies between two memory gate electrodes MG adjacent to each other in the direction X. The memory cell MC is a nonvolatile memory element having the control gate electrode CG, the memory gate electrode MG, the drain region MD, and the source region MS. A source region MS and a drain region MD configuring one of the memory cells MC may hereinafter be called a "source-drain region".

Two memory cells MC adjacent to each other in the direction X have a drain region MD or a source region MS in common. Two memory cells MC having the drain region MD in common are axisymmetrical in the direction X with the drain region MD extending in the direction Y as an axis, while two memory cells MC having the source region MS in common are axisymmetrical in the direction X with the source region MS extending in the direction Y as an axis.

The fins FA each have thereon a plurality of memory cells MC arranged in the direction X. The drain region MD of each of the memory cells MC is electrically coupled to, via a plug (contact plug) PG formed in a contact hole penetrating an interlayer insulating film (not illustrated) formed on the memory cell MC, a source line SL made of a wiring MW extending in the direction X. The source region MS of each of the plurality of memory cells MC arranged in the direction Y is electrically coupled to a bit line BL made of a wiring MW extending in the direction Y.

The fin FA is, for example, a cuboidal protruding portion which protrudes from the main surface of the semiconductor substrate SB in a direction perpendicular to the main surface. The fin FA is not always required to be a cuboid and in a cross-sectional view in a short-side direction, its rectangular shape may have a rounded corner portion. In addition, the side surfaces of the fin FA may each be perpendicular to the main surface of the semiconductor substrate SB, but they may have an angle near right angle as shown in FIG. 5. This means that each of the fins FA may have either a rectangular parallelepiped or trapezoidal cross-section. In this drawing, each of the side surfaces of the fin FA is inclined relative to the main surface of the semiconductor substrate SB.

As shown in FIG. 2, the extending direction of each of the fins FA is a long-side direction and a direction orthogonal to this long-side direction is a short-side direction of the fin in plan view. This means that the length of the fin is longer than the width of the fin. The fin FA has any shape insofar as it is a protruding portion having a length, a width, and a height. It may have, for example, a meandering layout in plan view.

FIG. 3 omits the illustration of an interlayer insulating film and a wiring on the element isolation film EI and each element, a cap insulating film on the control gate electrode CG, and a cap insulating film on the memory gate electrode. The fin FA configuring the semiconductor substrate SB in the memory cell region has thereon the memory cell MC. As shown in FIG. 3, the control gate electrode CG and the memory gate electrode MG extend in the direction Y so as to stride over the fin FA.

FIG. 4 shows the cross-section of the semiconductor element taken along the line A-A of FIG. 2. FIG. 5 shows the cross-section of the semiconductor element taken along the line B-B of FIG. 2. One fin has thereon a plurality of elements arranged, but the fin shown in FIGS. 3 and 4 has thereon only one memory cell.

As shown in FIG. 4, the control gate electrode CG has an upper surface covered with an insulating film IF4 and the memory gate electrode MG has an upper surface covered with an insulating film IF5. The insulating films IF4 and IF5 are each made of, for example, a silicon nitride film. The control gate electrode CG is made of, for example, a polysilicon film and the polysilicon film has an n type impurity (for example, P (phosphorus) or As (arsenic)) introduced therein. The memory gate electrode MG is made of, for example, a polysilicon film. The main characteristic of the present embodiment resides in the impurity concentration distribution in the memory gate electrode MG and this characteristic will be described later.

As shown in FIGS. 3 and 4, the fin FA having therein a diffusion region D1 configuring the source-drain region of the memory cell region has an upper surface and side surface covered with a silicide layer S1. The silicide layer S1 is made of, for example, NiSi (nickel silicide). The silicide layer S1 is present on the element isolation film EI. The silicide layer S1 is made of a layer extending along the upper surface and the side surface of the fin FA.

As shown in FIGS. 3 to 5, the fin FA is covered, at the lower portion of each of the side surfaces thereof, the element isolation film EI formed on the main surface of the semiconductor substrate SB. This means that the fins are separated from each other by the element isolation film EI. As shown in FIG. 4, the fin FA has therein a p well PW, which is a p type semiconductor region and extends from the upper surface to the lower portion of the fin FA.

The fin FA has, on the upper surface and side surface thereof, the control gate electrode CG via a gate insulating film GF. The control gate electrode CG has, in a region adjacent thereto, the memory gate electrode MG via an ONO film ON in the long-side direction (direction X) of the fin FA. The control gate electrode CG and the memory gate electrode MG have therebetween the ONO film ON and thus, the control gate electrode CG and the memory gate electrode MG are electrically separated from each other by the ONO film ON. In addition, the memory gate electrode MG and the upper surface of the fin FA have therebetween the ONO film ON. The ONO film ON is a continuous film that covers the side surface and the bottom surface of the memory gate electrode MG. The ONO film ON therefore has an L-shaped cross-section in the cross-sectional view along a gate length direction as shown in FIG. 4.

The gate insulating film GF is a thermal oxide film (silicon oxide film) formed by thermal oxidation of the main surface and side surface of the fin FA which is a protruding portion of the semiconductor substrate SB made of silicon. It has a film thickness of, for example, 2 nm. The ONO film ON is comprised of a silicon oxide film X1 made of a 4-nm thick thermal oxide film (silicon oxide film) formed by thermal oxidation of the main surface and side surface of the fin FA which is a protruding portion of the semiconductor substrate SB made of silicon, a silicon nitride film NF formed on the silicon oxide film X1, and a silicon oxide film X2 formed on the silicon nitride film NF. The silicon nitride film NF is a charge accumulation portion (charge accumulation layer) of the memory cell MC. The silicon nitride film has a thickness of, for example, 7 nm and the silicon oxide film X2 has a thickness of, for example, 9 nm.

This means that the ONO film ON has a stacked structure comprised of the silicon oxide film X1, the silicon nitride film NF, and the silicon oxide film X2 stacked successively from the upper surface side of the fin FA and the side surface side of the control gate electrode CG. The thickness of the ONO film ON is, for example, 20 nm and is greater than that of the gate insulating film GF below the control gate electrode CG. The silicon oxide film X2 may be made of a silicon oxynitride film.

In the short-side direction (direction Y) of the fin FA, the control gate electrode CG extends along the upper surface and side surface of the fin FA and the upper surface of the element isolation film EI via the gate insulating film GF. Similarly, in the short-side direction of the fin FA, the memory gate electrode MG extends along the main surface and side surface of the fin FA and the upper surface of the element isolation film EI via the ONO film ON.

A pattern including the control gate electrode CG, the memory gate electrode MG, the gate insulating film GF, the ONO film ON, and the insulating films IF4 and IF5 has a side surface covered with a side wall (sidewall spacer) SW. The side wall SW is made of a stacked structure of, for example, a silicon nitride film and a silicon oxide film. The silicide layer S1 covers therewith the above-described pattern including the control gate electrode CG and the surface of the fin FA exposed from the above-described side wall SW.

As shown in FIG. 4, a pair of source and drain regions is in the upper surface of the fin FA so as to sandwich the upper surface of the fin FA immediately below the above-described pattern including the control gate electrode CG. The source region and the drain region each have an extension region EX which is an n⁻ type semiconductor region and a diffusion region D1 which is an n⁺ type semiconductor region. The diffusion region D1 has an impurity concentration and a formation depth greater than those of the extension region EX. In each of the source region and the drain region, the extension region EX and the diffusion region D1 are contiguous to each other. Compared with the diffusion region D1, the extension region EX is located on the side closer to the upper surface of the fin FA immediately below the above-described pattern, in other words, on the side closer to a channel region.

The drain region is adjacent to the fin FA immediately below the control gate electrode CG and the source region is adjacent to the fin FA immediately below the memory gate electrode MG. This means that the source and drain regions, in plan view, sandwich therebetween the pattern including the control gate electrode CG and the memory gate electrode MG and the drain region is located on the side of the control gate electrode CG and the source region is located on the side of the memory gate electrode. In other words, in plan view, the drain region is adjacent to the control gate electrode CG and the source region is adjacent to the memory gate electrode MG.

Thus, by forming a source-drain region having a structure equipped with the extension region EX having a low impurity concentration and the diffusion region D1 having a high impurity concentration, that is, an LDD (lightly doped drain) structure, a transistor having the source-drain region can have an improved short-channel characteristic. The source region corresponds to the source region MS shown in FIG. 2 and the drain region corresponds to the drain region MD shown in FIG. 2.

The fin FA and the element isolation film EI have thereon an interlayer insulating fil IL made of, for example, a silicon oxide film. The interlayer insulating film IL covers each of the fin FA, the element isolation film EI, the control gate electrode CG, the memory gate electrode MG, the source-drain region, the insulating films IF4 and IF5, the side wall SW, and the silicide layer S1. The interlayer insulating film IL has a planarized upper surface.

The interlayer insulating film IL has thereon a plurality of wirings M1 and the wirings M1 are electrically coupled to the source region and the drain region of the memory cell MC via a plug PG provided in a contact hole penetrating the interlayer insulating film IL. This means that the plug PG has a bottom surface directly contiguous to the upper surface of the silicide layer S1 and the plug PG is electrically coupled to the source-drain region via the silicide layer S1. The silicide layer S1 has a role of reducing the coupling resistance between the plug PG which is a coupling portion made of a metal film composed mainly of, for example, tungsten (W) and the source-drain region in the fin FA made of a semiconductor.

In the power feed region (not illustrated) of the control gate electrode CG, the control gate electrode CG does not have thereon the insulating film IF4 because of removal and the plug is coupled to the upper surface of the control gate electrode CG via the silicide layer. In the power feed region (not illustrated) of the memory gate electrode MG, the memory gate electrode MG does not have thereon the insulating film IF5 because of removal and the plug is coupled to the upper surface of the memory gate electrode MG via the silicide layer.

The memory cell MC is a nonvolatile memory element having the control gate electrode CG, the memory gate electrode MG, the drain region, and the source region. The control gate electrode CG and the source-drain region configure a control transistor and the memory gate electrode MG and the source-drain region configure a memory transistor. The memory cell MC is comprised of the control transistor and the memory transistor. This means that the control transistor and the memory transistor have one source-drain region in common. A distance between the drain region and the source region in the gate length direction (direction X) of the control gate electrode CG and the memory gate electrode MG corresponds to a channel length of the memory cell MC. The control transistor and the memory transistor are FINFET having the surface of the fin FA as a channel.

Here, as shown in FIG. 5, the memory gate electrode MG of the present embodiment covers, in the gate width direction (direction Y in FIG. 1), the side surface (side wall) and the upper surface of the fin FA via the ONO (oxide nitride oxide) film ON. This means that the memory gate electrode MG is present on the upper surface and the side surface of the fin FA via the ONO film ON. In other words, the side surface of the fin FA is adjacent to the memory gate electrode MG in the direction Y running along the main surface of the semiconductor substrate SB and the upper surface of the fin FA is adjacent to the memory gate electrode MG in a direction perpendicular to the main surface of the semiconductor substrate SB.

The main characteristic of the present embodiment is that the n type impurity (for example, P (phosphorus) or As (arsenic)) concentration in the memory gate electrode MG is smaller in the upper portion of the memory gate electrode MG than in the lower portion thereof. This is attributable to the distribution of the n type impurity concentration in the memory gate electrode MG in which it increases gradually from the upper surface of the memory gate electrode MG to the lower surface thereof in a direction perpendicular to the main surface of the semiconductor substrate SB. The term "lower surface of the memory gate electrode MG" means the lowermost surface of the memory gate electrode MG contiguous to the upper surface of the element isolation film EI. The concentration distribution is not required to have such a gradation. For example, with the height of the upper surface of the fin FA as a boundary, the impurity concentration of the memory gate electrode MG above the boundary may be substantially fixed and the impurity concentration of the memory gate electrode MG below the boundary may be substantially fixed.

The height position of the boundary may be a little above or below the height of the upper surface of the fin FA. The n type impurity concentration of the lower surface of the memory gate electrode MG contiguous to the upper surface of the ONO film ON that covers the upper surface of the fin FA is at least smaller than the n type impurity concentration of the side surface of the memory gate electrode MG contiguous to the side surface of the ONO film ON that covers the side surface of the fin FA. In other words, the average n type impurity concentration of the lower surface of the memory gate electrode MG contiguous to the upper surface of the ONO film ON that covers the upper surface of the fin FA is smaller than the average n type impurity concentration of the side surface of the memory gate electrode MG contiguous to the side surface of the ONO film ON that covers the side surface of the fin FA.

In the present embodiment, the n type impurity concentration of the memory gate electrode MG formed above the upper surface of the fin FA is smaller than the n type impurity concentration of the memory gate electrode MG formed below the upper surface of the fin FA. In other words, the average n type impurity concentration of the memory gate electrode MG formed above the upper surface of the fin FA is smaller than the average n type impurity concentration of the memory gate electrode MG formed below the upper surface of the fin FA.

A portion of the memory gate electrode MG formed above the uppermost surface of the fin FA and contiguous to the upper surface of the ONO film ON contiguous to the uppermost surface of the fin FA will hereinafter be called "upper electrode" and a portion of the memory gate electrode MG adjacent to the side surface of the fin FA via the ONO film ON in the direction Y will hereinafter be called "lower electrode". The memory gate electrode MG is therefore equipped with the lower electrode and the upper electrode thereon and the lower electrode and the upper electrode have a boundary at a height, for example, equal to that of the upper surface of the fin FA.

It is to be noted that the ONO film ON present between the memory gate electrode MG and the control gate electrode CG is not included in any of the ONO film ON contiguous to the upper surface of the fin FA, the ONO film ON that covers the upper surface of the fin FA, the ONO film ON contiguous to the side surface of the fin FA, and the ONO film ON that covers the side surface of the fin FA.

The upper electrode extends from the upper surface of the memory gate electrode MG to at least the upper surface of the ONO film ON contiguous to the upper surface of the fin FA. The lower electrode extends from the interface between the memory gate electrode MG and the element isolation film EI to any position between the upper end and the lower end of the side surface of the ONO film ON that covers the side surface of the fin FA.

The memory gate electrode MG is made of a semiconductor film formed by, after formation of a polysilicon film having, for example, an uniformly introduced n type impurity, introducing a p type impurity into the upper surface side of the polysilicon film. Implantation of the p type impurity into the memory gate electrode MG above the upper surface of the fin FA makes the n type impurity concentration of the upper electrode lower than that of the lower electrode. The upper electrode is therefore made of a polysilicon film in intrinsic form that shows neither an n type conductivity nor a p type conductivity. This means that the upper electrode is neither an n type nor a p type. In other words, the upper electrode is neither an n type semiconductor nor a p type semiconductor.

Here, the terms such as "a semiconductor shows an n type conductivity", "the conductivity type of a semiconductor is an n type", or "it is an n type semiconductor" mean that the major carrier of the semiconductor is an electron. The terms such as "a semiconductor shows a p type conductivity", "the conductivity type of a semiconductor is a p type", or "it is a p type semiconductor" means that the major carrier of the semiconductor is a hole. The term "intrinsic form" means that the electron concentration and the hole concentration are almost equal to each other or neither electrons nor holes as a carrier are generated.

In the present application, a semiconductor having $1\times10^{20}$ atms/cm$^3$ or more of n type impurity atoms is called a semiconductor showing an n type conductivity. This means that a semiconductor region (semiconductor layer) having $1\times10^{20}$ atms/cm$^3$ or more of n type impurity atoms is an n type semiconductor region (semiconductor layer). A semiconductor having $1\times10^{18}$ atms/cm$^3$ or more and less than $1\times10^{20}$ atms/cm$^3$ of n type impurity atoms and not showing a p type conductivity is called a semiconductor in intrinsic form not showing an n type conductivity or a lightly-doped semiconductor. This means that a semiconductor region (semiconductor layer) having $1\times10^{18}$ atms/cm$^3$ or more and less than $1\times10^{20}$ atms/cm$^3$ of n type impurity atoms is a lightly-doped semiconductor region (semiconductor layer).

The upper electrode is an n type semiconductor layer having $1\times10^{18}$ atms/cm$^3$ or more and less than $1\times10^{20}$ atms/cm$^3$ of n type impurity atoms. The lower electrode is an n type semiconductor layer having $1\times10^{20}$ atms/cm$^3$ or more of n type impurity atoms. Thus, the n type impurity concentration of the upper electrode is lower than that of the lower electrode. Here, the n type semiconductor layer and the lightly-doped semiconductor layer are discriminated based on whether the number of n type impurity atoms is $1\times10^{20}$ atms/cm$^3$ or more or not, because when the memory cell MC performs write operation, depletion of the memory gate electrode MG occurs, depending on this number of n type impurity atoms.

Described specifically, when the memory cell MC performs write operation, a voltage of, for example, 10V is applied to the memory gate electrode MG. A depletion layer does not form easily in the memory gate electrode MG when the number of n type impurity atoms in the memory gate electrode MG is $1\times10^{20}$ atms/cm$^3$ or more, but it forms easily in the memory gate electrode easily when the number of the atoms is less than $1\times10^{20}$ atms/cm$^3$. In the present embodiment, as will be described later, unbalanced injection of electrons into the ONO film ON in the vicinity of the upper surface of the fin FA is prevented by configuring the upper electrode of the memory gate electrode MG from a lightly-doped semiconductor layer which is easily depleted.

<Operation of Nonvolatile Memory>

Operation of mainly a nonvolatile memory of the semiconductor device of the present embodiment will next be described referring to FIG. 32. FIG. 32 is a table for describing the operating voltage of a split-gate memory cell.

The memory cell of the present embodiment has a MISFET (metal insulator semiconductor field effect transistor) structure. It uses the charge accumulation state in a trapping insulating film in the gate electrode of the MISFET as stored data and reads out the data as the threshold of the transistor. The trapping insulating film is an insulating film capable of accumulating charges therein and a silicon nitride film is one example of it. By injecting or releasing charges into or from such a charge accumulation region, the threshold of the MISFET is shifted to allow it to operate as a memory element. Examples of a nonvolatile semiconductor memory device using this trapping insulating film include a split-gate MONOS memory such as the memory cell of the present embodiment.

FIG. 32 is a table showing one example of voltage application conditions to each site of a selected memory cell during "write", "erase", and "read" in the present embodiment. The table in FIG. 32 describes, in the memory cell MC as shown in FIG. 3, a voltage Vmg to be applied to the memory gate electrode MG, a voltage Vs to be applied to the source region, a voltage Vcg to be applied to the control gate electrode CG, a voltage Vd to be applied to the drain region, and a base voltage Vb to be applied to the p well PW in the upper surface of the semiconductor substrate at the time of "write", "erase", and "read". The term "selected memory cell" as used herein means a memory cell selected as an object of "write", "erase", or "read" operation.

In the example of the nonvolatile memory shown in FIG. 3, the semiconductor region on the side of the memory gate electrode MG is a source region, while the semiconductor region on the side of the control gate electrode CG is a drain region. An example of preferred voltage application conditions is shown in the table of FIG. 32. The conditions are not limited to them, but can be changed variously if necessary. Further, in the present embodiment, injection of electrons and injection of holes into the silicon nitride film NF, which is a charge accumulation portion in the ONO film ON of the memory transistor, are defined as "write" and "erase" of data, respectively.

In the table of FIG. 32, the column A corresponds to an operation method using SSI for writing and BTBT for erasing; and the column B corresponds to an operation method using SSI for writing and FN for erasing.

The SSI can be regarded as an operation method in which writing of memory cells is performed by injecting hot electrons into the silicon nitride film NF (refer to FIG. 3). The BTBT can be regarded as an operation method in which erasing of memory cells is performed by injecting hot holes from the fin FA into the silicon nitride film NF. The FN can be regarded as an operation method in which erasing is performed by tunneling holes from the memory gate electrode MG to the silicon nitride film NF.

There are two writing methods, that is, a writing method in which writing is performed by hot electron injection using source side injection (hot electron injection writing method) which is so-called SSI (source side injection) and a writing method in which writing is performed by FN (Fowler Nordheim) tunneling (tunneling writing method) which is so-called FN. In the present application, the writing method using SSI will be described.

In the SSI writing method, writing is performed, for example, by applying voltages (Vmg=10 V, Vs=5 V, Vcg=1 V, Vd=0.5 V, Vb=0 V) as shown in "write operation voltage" in the column A or column B in the table of FIG. 32 to respective sites of the selected memory cell that performs writing and thereby injecting electrons into the silicon nitride film FN in the ONO film ON of the selected memory cell.

In this case, hot electrons are generated in the channel region (between source and drain) below and between two gate electrodes (memory gate electrode MG and control gate electrode CG) and the resulting hot electrons are injected into the silicon nitride film NF, which is a charge accumulation portion in the ONO film ON below the memory gate electrode MG. The hot electrons (electrons) thus injected are trapped in the trap level in the silicon nitride film NF configuring the ONO film ON. This leads to an increase in the threshold voltage of the memory transistor. This means that the memory transistor is brought to a write state.

There are two erasing methods, that is, an erasing method in which erasing is performed by injecting hot holes by BTBT (band-to-band tunneling: inter-band tunneling phenomenon) (hot hole injection erasing method) which is so-called BTBT and an erasing method in which erasing is performed by FN (Fowler Nordheim) tunneling (tunneling erasing method) which is so-called FN.

In the BTBT erasing method, erasing is performed by injecting holes generated by BTBT into a charge accumulation portion (the silicon nitride film NF in the ONO film ON) from the side of the fin FA. For example, voltages (Vmg=−6 V, Vs=6 V, Vcg=0 V, Vd=open, Vb=0 V) as shown in "erase operation voltage" in the column A in the table of FIG. 32 are applied to the respective sites of the selected memory cell that performs erasing. By generating holes by the BTBT phenomenon, accelerating the electric field, and thereby injecting holes into the silicon nitride film NF configuring the ONO film ON of the selected memory cell, the threshold voltage of the memory transistor is reduced. The memory transistor is therefore brought to an erase state.

In the FN erasing method, erasing is performed, for example, by applying voltages (Vmg=12 V, Vs=0 V, Vcg=0 V, Vd=0 V, Vb=0 V) as shown by "erase operation voltage" in the column B in the table of FIG. 32 to the respective sites of the selected memory cell that performs erasing, causing the holes to tunnel from the memory gate electrode MG in the selected memory cell, and injecting the resulting holes into the silicon nitride film NF in the ONO film ON. During this erasing, the holes are injected from the memory gate electrode MG into the ONO film ON while tunneling the silicon oxide film X2 by FN tunneling (FN tunneling effect) and are trapped in the trap level in the silicon nitride film NF configuring the ONO film ON. This results in reduction in the threshold voltage of the memory transistor. This means that the memory transistor is brought to an erase state.

During reading, for example, voltages as shown by "read operation voltage" in the column A or column B in the table of FIG. 32 are applied to the respective sites of the selected memory cell that performs reading. The write state and the erase state can be discriminated by setting the voltage Vmg to be applied to the memory gate electrode MG at the time of reading to a value between the threshold voltage of the memory transistor in the write state and the threshold voltage in the erase state.

<Advantage of Semiconductor Device>

Figure 33:
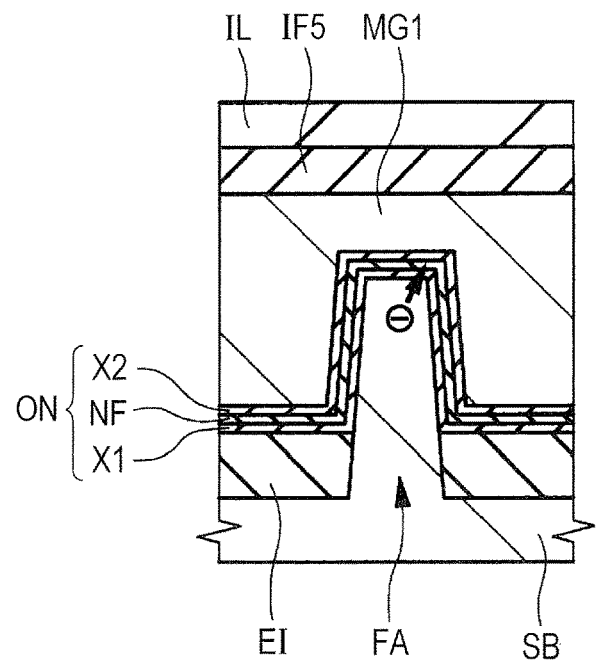
FIG. 33 is a cross-sectional view showing a semiconductor device of Comparative Example.

The advantage of the semiconductor device of the present embodiment will hereinafter be described referring to Comparative Example shown in FIG. 33. FIG. 33 is a cross-sectional view of a semiconductor device of Comparative Example. FIG. 33 is a cross-sectional view corresponding to that of FIG. 5 and it shows a fin, an ONO film, and a memory gate electrode. The semiconductor device of Comparative Example shown in FIG. 33 is different from the semiconductor device of the present embodiment in that the n type impurity concentration of a memory gate electrode MG1 is almost uniform from the upper surface of an element isolation film EI to the upper surface of the memory gate electrode MG1 and the memory gate electrode MG1 is made entirely of a polysilicon film showing an n type conductivity.

The memory cell of a MONOS memory comprised of an FINFET has the surface of a fin as a channel region and this structure is causative of its peculiar problems. One of the peculiar problems is delay in writing speed after operation of the memory cell a plurality of times, that is, deterioration in writing characteristic. Another peculiar problem is a reduction in writing frequency guaranteed in a nonvolatile memory device comprised of a plurality of memory cells, that is, deterioration in endurance.

These problems occur due to the protruded shape of the fin from a semiconductor substrate. In an FINFET having a gate electrode formed so as to stride over the upper end of the fin, an electric field has an increased strength particularly at the upper end of the fin during operation of the transistor. In this case, in the memory cell including the FINFET, as shown in FIG. 33, electrons are easily injected from the vicinity of the upper surface of the fin FA having a strong electric field into the silicon nitride film NF in the ONO film ON formed in the vicinity of the upper surface of the fin FA.

As a result, electrons are injected intensively into the ONO film ON in the vicinity of the upper surface of the fin FA by the write operation performed a plurality of times, while almost no electrons are injected into the ONO film ON contiguous to the side surface of the fin FA. This means that there occurs a difference in electron injection distribution between the ONO film ON that covers the upper surface of the fin FA and the ONO film ON that covers the side surface of the fin FA. In other words, there occurs a difference in electron injection distribution in the gate width direction of the FINFET.

Electrons are thus injected into only the ONO film ON on the fin FA not the ONO film ON that covers the surface of the fin including the upper surface and side surface of the fin FA, resulting in problems such as deterioration in write characteristics and deterioration in endurance. When electrons are injected into the ONO film ON in the vicinity of the upper surface of the fin FA and writing is performed, an electric field drastically weakens so that delay in write operation as described above occurs.

In the semiconductor device of the present embodiment, the upper electrode configuring the memory gate electrode MG shown in FIG. 4 is comprised of a lightly-doped semiconductor layer which easily forms a depletion layer in order to prevent unbalanced electron injection into the ONO film ON in the vicinity of the upper surface of the fin FA. In other words, by setting the n type impurity concentration of a portion of the memory gate electrode MG that covers the upper surface of the fin FA via the ONO film ON lower than the n type impurity concentration of a portion of the memory gate electrode MG that covers the side surface of the fin FA via the ONO film ON, the upper electrode which is a lightly-doped semiconductor layer is more easily depleted than the lower electrode which is an n type semiconductor layer when a voltage is applied to the memory gate electrode MG at the time of write operation of the memory cell MC.

The injection amount of electrons into the ONO film ON in the vicinity of the upper surface of the fin FA can therefore be reduced. This makes it possible to prevent a difference in electron injection distribution between the ONO film ON that covers the upper surface of the fin FA and the ONO film ON that covers the side surface of the fin FA and to inject electrons more uniformly into the entire silicon nitride film NF that covers the surface of the fin FA. As a result, problems such as deterioration in write characteristics and deterioration in endurance can be prevented and the semiconductor device thus obtained can have improved reliability.

The boundary between the lower electrode and upper electrode that configure the memory gate electrode MG, that is, a boundary of the memory gate electrode MG between a region having a low n type impurity concentration and a region having a high n type impurity concentration is desirably located, for example, at a height equal to the upper surface of the fin FA. It is because when the boundary is below the position of the upper surface of the fin FA, the threshold voltage of the memory transistor having the memory gate electrode MG decreases as the boundary becomes closer to the element isolation film EI. This means that the position of the boundary between the lower electrode and the upper electrode at a height substantially equal to the upper surface of the fin FA enables both prevention of a reduction of the threshold voltage of the memory transistor and achievement of a uniform electron injection distribution.

For example, when the boundary is present at a height between the upper surface of the ONO film ON that covers the upper surface of the fin FA and the upper surface of the fin FA, a portion of the memory gate electrode MG contiguous to the upper surface of the ONO film ON that covers the upper surface of the fin FA can be made intrinsic and a portion of the memory gate electrode MG contiguous to the ONO film ON that covers the side surface of the fin FA can be comprised of an n type semiconductor layer. This makes it possible to prevent a reduction in the electron injection amount into the ONO film ON that covers the side surface of the fin FA and at the same time, to prevent a reduction in the electron injection amount into the ONO film ON in the vicinity of the upper surface of the fin FA. As a result, there occurs no difference in the electron injection distribution into the ONO film ON. The above-described advantage can be obtained remarkably.

An increase in the threshold voltage of the transistor configuring the MONOS memory seems to be caused by making a portion of the memory gate electrode MG intrinsic. The present inventors however have found by a test and the like that there occurs almost no variation in the threshold voltage of the memory transistor even if the upper electrode of the memory gate electrode MG is changed from an n type semiconductor layer to a semiconductor layer in intrinsic form. In short, the characteristics of the memory cell MC are hardly influenced even if the upper electrode of the memory gate electrode MG is made intrinsic.

<Manufacturing Steps of Semiconductor Device>

A method of manufacturing the semiconductor device of the present embodiment will hereinafter be described referring to FIGS. 6 to 22. FIGS. 6 to 22 are cross-sectional views of the semiconductor device of the present embodiment during its manufacturing steps. FIGS. 6 to 9 and FIG. 16 show the cross-section along the direction Y (refer to FIG. 2). FIGS. 10 to 15 and FIGS. 17 to 22 show the cross-section along the direction X (refer to FIG. 2). FIGS. 6 to 9 and FIG. 16 omit the illustration of a well. FIGS. 6 to 9 perpendicularly show the side surface of each fin but the actual side surface of the fin has a taper relative to the main surface of the semiconductor substrate as shown in FIG. 16.

Figure 6:
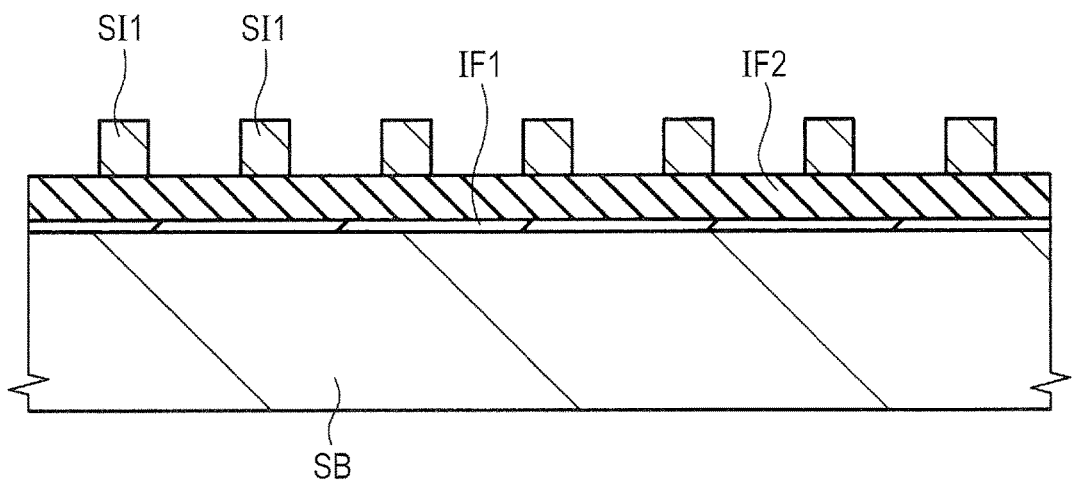
FIG. 6 is a cross-sectional view of the semiconductor device of First Embodiment of the invention during a manufacturing step thereof.

First, as shown in FIG. 6, a semiconductor substrate SB is prepared. An insulating film IF1, an insulating film IF2, and a semiconductor film SI1 are formed on the main surface of the semiconductor substrate SB in order of mention. The semiconductor substrate SB is made of, for example, p type single crystal silicon having a specific resistance of from about 1 to 10 Ωcm. The insulating film IF1 is made of, for example, a silicon oxide film and can be formed, for example, by oxidation or CVD (chemical vapor deposition). The insulating film IF1 has a thickness of from about 2 to 10 nm. The insulating film IF2 is made of, for example, a silicon nitride film and it has a thickness of, for example, from about 20 to 100 nm. The insulating film IF2 is formed using, for example, CVD. The semiconductor film SI1 is made of, for example, a silicon film and is formed using, for example, CVD. The semiconductor film SI1 has a thickness of, for example, from 20 to 200 nm.

Then, the semiconductor film SI1 is processed using photolithography and etching to form, in the direction Y, a plurality of patterns of the semiconductor film SI1 extending in the direction X on the insulating film IF2. FIG. 6 is a cross-sectional view including the plurality of patterns of the semiconductor film SI1 and it is a cross-sectional view along the short direction of each of the patterns of the semiconductor film SI1.

Figure 7:
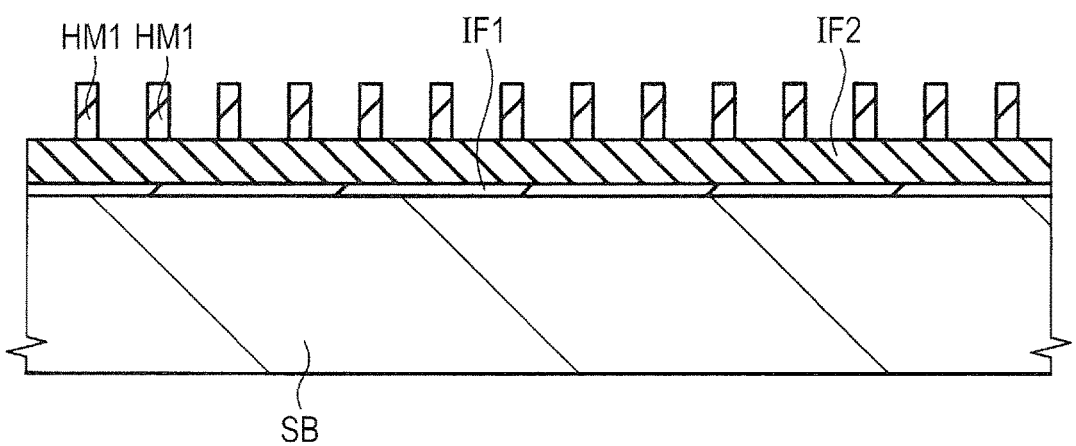
FIG. 7 is a cross-sectional view of the semiconductor device during a manufacturing step following that of FIG. 6.

Next, as shown in FIG. 7, a hard mask HM1 that covers the side surface of each of the semiconductor films ST1 is formed. In this step, after formation of a silicon oxide film having a thickness of from 10 to 40 nm on the semiconductor substrate SB by CVD, dry etching is performed as anisotropic etching. The upper surface of each of the insulating film IF2 and the semiconductor film SI1 is thereby exposed to form the hard mask HM1 made of the silicon oxide film which has remained on the side surface of the semiconductor film SI1. The hard mask HM1 does not completely fill between the semiconductor films SI1 adjacent to each other. The hard mask HM1 thus formed has a ring form so as to surround each of the semiconductor films SI1 in plan view.

Then, the semiconductor film SI1 is removed using wet etching, followed by partial removal of the hard mask HM1 by photolithography and etching. Described specifically, a portion of the hard mask HM1 extending in the direction X is left and the other portion, that is, a portion extending in the direction Y is removed. The hard mask HM1 thus obtained therefore does not have a ring structure and only a pattern extending in the direction X remains as the hard mask HMI. In other words, the hard masks HM1 which are patterns extending in the direction X are arranged on the insulating film IF2 in the direction Y.

Figure 8:
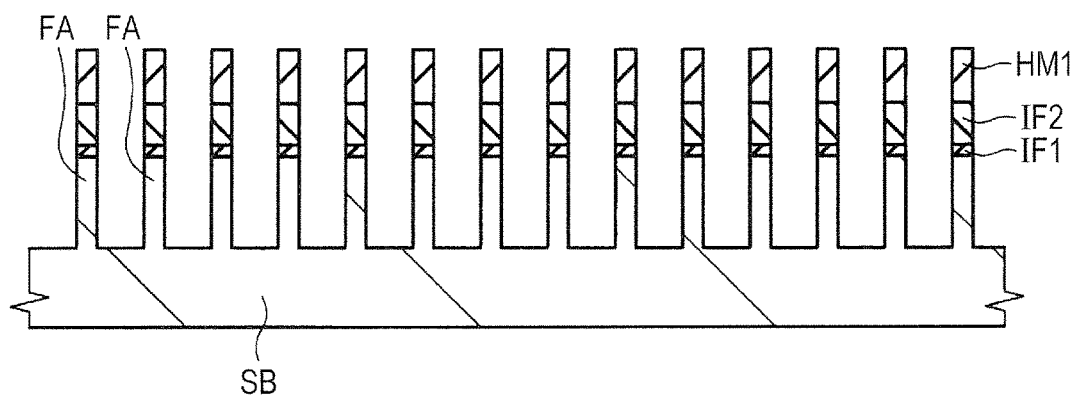
FIG. 8 is a cross-sectional view of the semiconductor device during a manufacturing step following that of FIG. 7.

Next, as shown in FIG. 8, with the hard masks HM1 as a mask, the insulating films IF2 and IF1 and the semiconductor substrate SB are anisotropically dry etched to form, immediately below the hard masks HM1, plate-like (wall-like) patterns made of a portion of the semiconductor substrate SB, that is, fins FA. In this step, the fins FA having a height of from 100 to 250 nm from the main surface of the semiconductor substrate SB can be formed by digging the main surface of the semiconductor substrate SB in a region exposed from the hard masks HM1 by from 100 to 250 mm.

Figure 9:
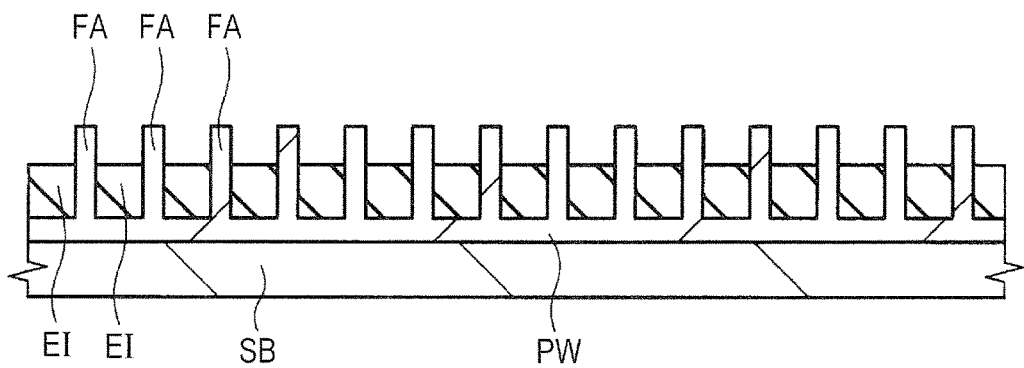
FIG. 9 is a cross-sectional view of the semiconductor device during a manufacturing step following that of FIG. 8.

Next, as shown in FIG. 9, an insulating film made of a silicon oxide film or the like is deposited on the semiconductor substrate SB so as to completely fill between the fins FA, between the insulating films IF1, and between the insulating films IF2. Then, this insulating film is polished by CMP (chemical mechanical polishing) to expose the upper surface of the insulating film IF2. Thus, an element isolation film EI made of the insulating film is formed. By the CMP step, the hard masks HM1 are removed. The hard masks HM1 may be removed before formation of the insulating film configuring the element isolation film EI.

Then, the insulating films IF1 and IF2 are removed. Then, the upper surface of the element isolation film EI is etched to cause the upper surface of the element isolation film EI to retreat (lower) in a direction perpendicular to the main surface of the semiconductor substrate SB. Thus, a portion of the side surface of each of the fins FA and the upper surface thereof are exposed.

Then, a p well PW is formed in the fin FA by introducing an impurity into the main surface of the semiconductor substrate SB by ion implantation. The p well PW is formed by implantation of a p type impurity (for example, B (boron)). The p well PW extends in the entire fin FA and in a portion of the semiconductor substrate SB below the fin FA.

Figure 10:
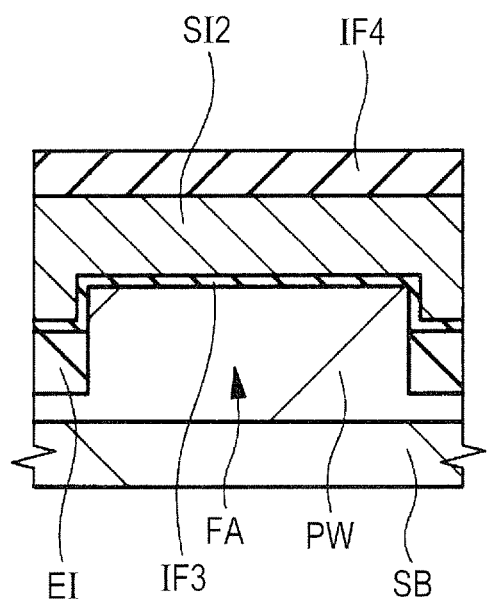
FIG. 10 is a cross-sectional view of the semiconductor device during a manufacturing step following that of FIG. 9.

Next, as shown in FIG. 10, an insulating film IF3 that covers the upper surface and the side surface of each of the fins FA is formed. The insulating film IF3 can be formed, for example, by thermal oxidation. It is composed of, for example, a silicon oxide film having a thickness of about 2 nm. Then, after deposition of a semiconductor film SI2 having a thickness equal to or more than the height of each of the fins FA by CVD on the insulating film IF3, the upper surface of the semiconductor film SI2 is planarized by CMP or the like. As a result, the semiconductor film SI2 has a flat upper surface. Then, an insulating film IF4 is formed on the semiconductor film SI2 using, for example, CVD. The semiconductor film SI2 is made of, for example, a polysilicon film (silicon film) and the insulating film IF4 is made of, for example, a silicon nitride film. Even after a polishing step of the semiconductor film SI2 is performed by CMP as described above, the semiconductor film SI2 remains on the upper surface of the fin FA.

Figure 11:
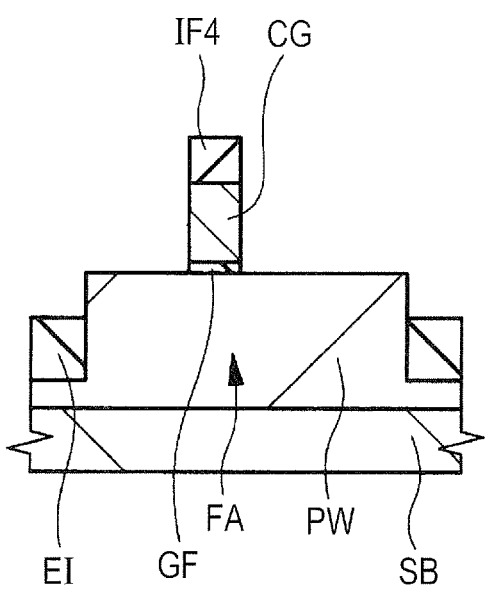
FIG. 11 is a cross-sectional view of the semiconductor device during a manufacturing step following that of FIG. 10.

Next, as shown in FIG. 11, a photoresist film (not illustrated) that covers immediately above a portion of the fin FA is formed. The resulting photoresist film includes a resist pattern formed so as to cover a portion of each of the fins FA arranged in the direction Y (depth direction of this drawing) and extending in the direction Y. In a region on the side of the resist pattern, the upper surface of the fin FA is exposed from the photoresist film.

Then, with the photoresist film as a mask, etching is performed to remove a portion of each of the insulating film IF4 and the semiconductor film SI2 and thereby expose the upper surface of the element isolation film EI and the surface of the insulating film IF3. This means that a portion of the upper surface and a portion of the side surface of the fin FA are exposed from the insulating film IF4 and the semiconductor film SI2. Thus, a control gate electrode CG made of the semiconductor film SI2 is formed on the fin FA. In addition, a gate insulating film GF made of the insulating film IF3 between the control gate electrode CG and the fin FA is formed.

In the above description, the insulating film IF3 that covers the surface of the fin FA exposed from the control gate electrode CG is removed by the above-described etching and a washing step performed subsequently and the surface of the fin FA is exposed. Alternatively, the upper surface and the side surface of the fin FA may still be covered with the insulating film IF3.

Figure 12:
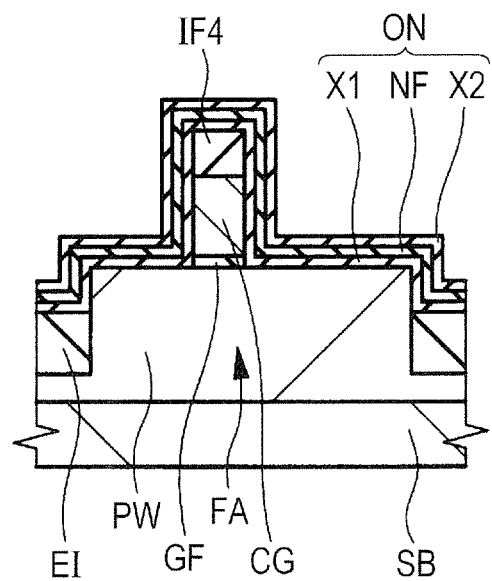
FIG. 12 is a cross-sectional view of the semiconductor device during a manufacturing step following that of FIG. 11.

Next, as shown in FIG. 12, a silicon oxide film (bottom oxide film) X1, a silicon nitride film NF, and a silicon oxide film (top oxide film) X2 are formed on the semiconductor substrate SB in order of mention to form an ONO film ON having a stacked structure comprised of the silicon oxide film X1, the silicon nitride film NF, and the silicon oxide film X2. In short, the ONO (oxide nitride oxide) film ON is a stacked insulating film. The silicon oxide film X1 can be formed by oxidation or CVD. The silicon nitride film NF and the silicon oxide film X2 are formed (deposited), for example, by CVD.

The ONO film ON covers the upper surface of the element isolation film EI and also the upper surface and side surface of the fin FA. The ONO film ON covers the upper surface and side surface of a stacked pattern comprised of the control gate electrode CG and the insulating film IF4. The silicon nitride film NF is a film functioning as a charge accumulation portion (charge accumulation film) of a memory cell to be formed later but the silicon nitride film NF may be replaced by a high-k film made of HfSiO or the like. Also the silicon oxide film X1 may be replaced by an AlO (aluminum oxide) film.

Figure 13:
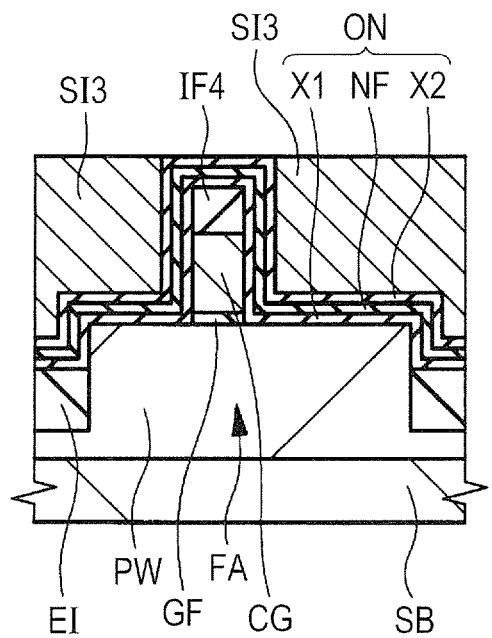
FIG. 13 is a cross-sectional view of the semiconductor device during a manufacturing step following that of FIG. 12.

Next, as shown in FIG. 13, a semiconductor film SI3 is formed on the semiconductor substrate SB, for example, by CVD. The semiconductor film SI3 is made of, for example, a polysilicon film and has a thickness greater than the height of a film stack including the control gate electrode CG and the insulating film IF4. Then, the upper surface of the semiconductor film SI3 is polished using CMP to expose the upper surface of the ONO film ON on the insulating film IF4.

The semiconductor film SI3 is formed, for example, as an n type semiconductor layer having $1 \times 10^{20}$ atms/cm$^3$ or more of an n type impurity (for example, P (phosphorus) or As (arsenic)) introduced therein at the time of formation. Alternatively, after formation of a semiconductor film SI3 having no impurity introduced therein, an n type impurity (for example, P (phosphorus) or As (arsenic)) may be introduced into the semiconductor film SI3 by ion implantation or the like. Anyway, the semiconductor film SI3 is an n type semiconductor layer having an n type impurity introduced therein almost uniformly from its upper surface to lower surface.

Figure 14:
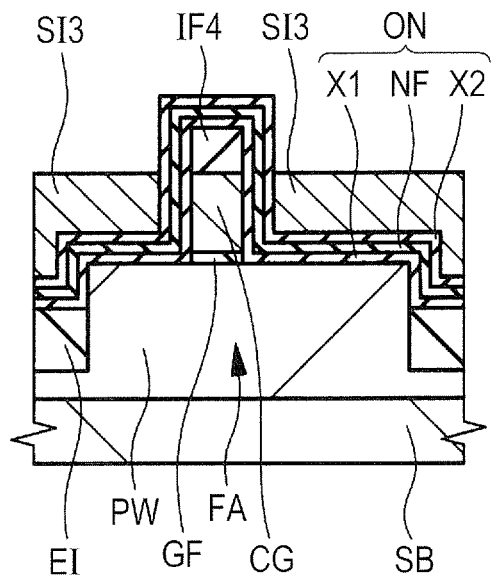
FIG. 14 is a cross-sectional view of the semiconductor device during a manufacturing step following that of FIG. 13.

Next, as shown in FIG. 14, an etch-back step is performed to cause the upper surface of the semiconductor film SI3 to retreat. As a result, the upper surface of the semiconductor film SI3 has a height almost equal to the upper surface of, for example, the control gate electrode CG.

Figure 15:
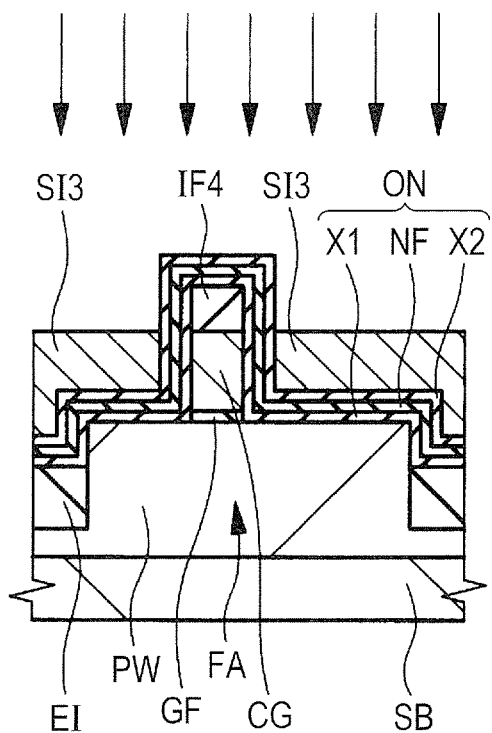
FIG. 15 is a cross-sectional view of the semiconductor device during a manufacturing step following that of FIG. 14.
Figure 16:
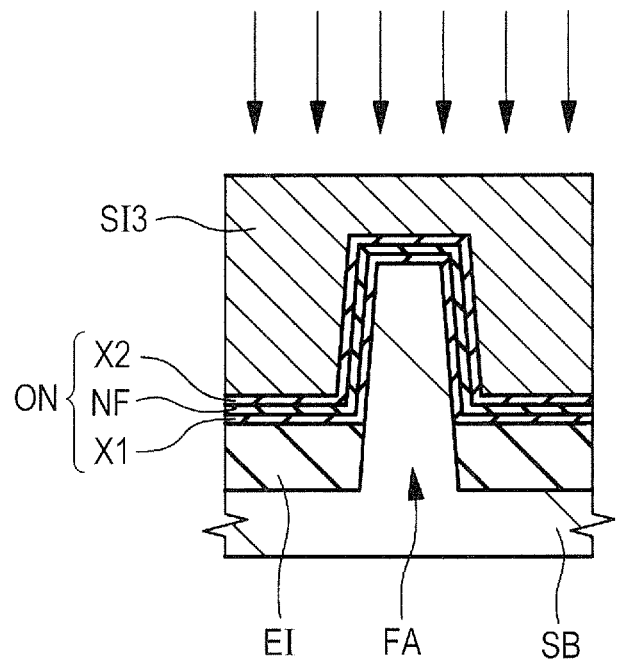
FIG. 16 is a cross-sectional view of the semiconductor device shown in FIG. 15 along a direction Y.

Next, as shown in FIGS. 15 and 16, a p type impurity (for example, B (boron) or BF$_2$ (boron fluoride)) is implanted into the upper surface of the semiconductor film SI3, for example, by ion implantation. Here, the impurity introduced has an conductivity type different from that in the semiconductor film SI3. The ion implantation is performed from above the semiconductor film SI3 to the upper surface of the semiconductor film SI3 in a direction perpendicular to the main surface of the semiconductor substrate SB.

In this ion implantation step, implantation energy and the like are adjusted so as to implant a p type impurity into the semiconductor film SI3 located in a region higher than the upper surface of the fin FA while preventing the p type impurity from being implanted into the semiconductor film SI3 located in a region lower than the upper surface of the fin FA as much as possible. FIG. 16 shows a cross-section taken along the direction Y and it includes the semiconductor film SI3 in a region adjacent to the control gate electrode CG (refer to FIG. 15).

By this processing, the semiconductor film SI3 adjacent to the upper surface of the ONO film ON that covers the upper surface of the fin FA, that is, a portion of the semiconductor film SI3 on the upper surface of the fin FA becomes a film in intrinsic form, that is, a film showing neither an n type conductivity nor a p type conductivity. The conductivity of a portion of the semiconductor film SI3 adjacent to the side surface of the ONO film ON that covers the side surface of the fin FA, that is, the conductivity of a portion of the semiconductor film SI3 lower than the upper surface of the fin FA remains an n type. This means that in the ion implantation step, by performing counter doping to implant an impurity having a conductivity type different from that of the semiconductor film SI3 before the ion implantation step into the upper surface of the semiconductor film SI3, the upper portion of the semiconductor film SI3 has an n type impurity concentration smaller than that of the lower portion of the semiconductor film SI3.

Since the upper portion of the semiconductor film SI3 has a p type impurity introduced therein, the number, per volume, of a p type impurity contained in a portion of the semiconductor film SI3 adjacent to the fin FA in the direction Y is smaller than the number, per volume, of a p type impurity contained in a portion of the semiconductor film SI3 on the upper surface of the fin FA. A memory gate electrode to be formed later by processing the semiconductor film SI3 also has a constitution similar to that of the above-described semiconductor film SI3. This means that the number, per volume, of a p type impurity contained in a portion of the memory gate electrode adjacent to the fin FA in the direction Y is smaller than the number, per volume, of a p type impurity contained in a portion of the memory gate electrode on the upper surface of the fin FA.

Figure 17:
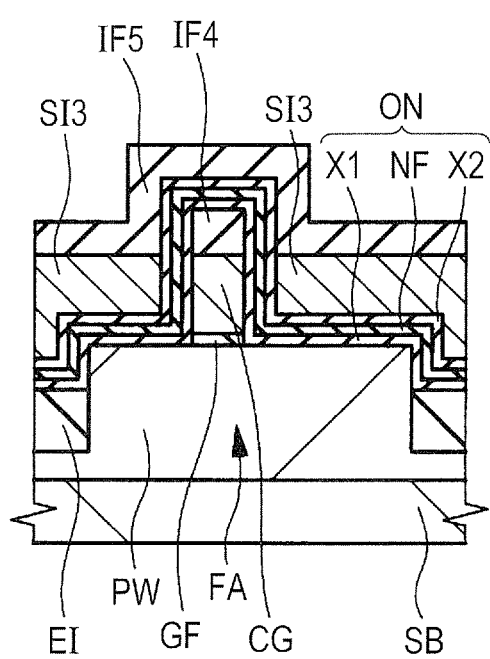
FIG. 17 is a cross-sectional view of the semiconductor device during a manufacturing step following that of FIG. 16.

Next, as shown in FIG. 17, an insulating film IF5 is formed on the semiconductor substrate SB, for example, by CVD. The insulating film IF5 is made of, for example, a silicon nitride film and it covers the side surface and upper surface of the insulating film IF4 and the upper surface of the semiconductor film SI3 via the ONO film ON.

Figure 18:
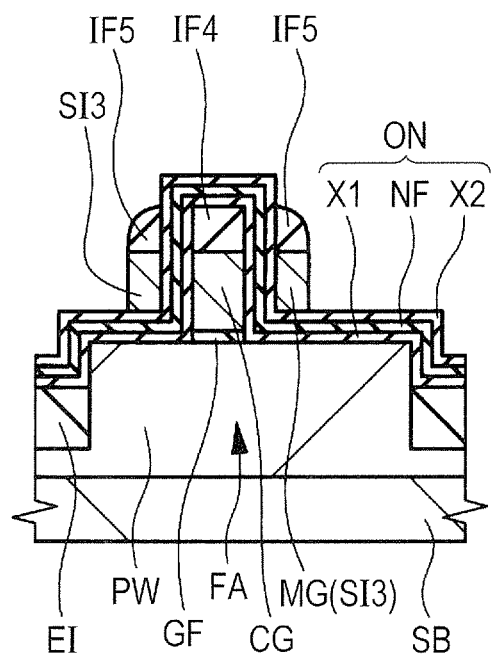
FIG. 18 is a cross-sectional view of the semiconductor device during a manufacturing step following that of FIG. 17.

Next, as shown in FIG. 18, dry etching is performed to remove a portion of the insulating film IF5 and thereby partially expose the upper surface of the ONO film ON and the upper surface of the semiconductor film SI3. This means that the insulating film IF5 remains like a side wall on the side surface of the insulating film IF4 via the ONO film ON. Then with the insulating film IF5 as a mask, etching is performed to process the semiconductor film SI3. By this processing, the semiconductor film SI3 remains in a region close to the side surface on both sides of the control gate electrode CG and, in a region other than the region close to the side surface on both sides of the control gate electrode CG, the upper surface of the fin FA is exposed from the semiconductor film SI3.

The semiconductor film SI3 close to one of the side surfaces of the control gate electrode CG in a gate length direction (direction X) via the ONO film ON configures the memory gate electrode MG. The memory gate electrode MG neighbors to the control gate electrode CG and extends in the direction Y so as to stride over the plurality of fins FA.

Figure 19:
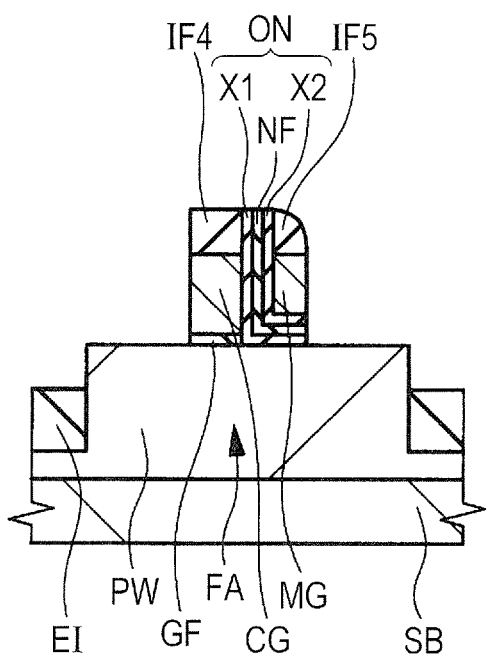
FIG. 19 is a cross-sectional view of the semiconductor device during a manufacturing step following that of FIG. 18.

Next, as shown in FIG. 19, after formation of a resist pattern (not illustrated) that covers the memory gate electrode MG and the insulating film IF5 immediately thereabove, etching is performed to remove the insulating film IF5 and the semiconductor film SI3 exposed from the resist pattern. By this removal, the memory gate electrode MG remains on one of the side surfaces of the control gate electrode CG in the gate length direction and the other side surface of the control gate electrode CG is exposed.

Next, the ONO film ON not covered with the insulating film IF5 and the memory gate electrode MG is removed by etching. By this etching, the upper surface of the insulating film IF4, the upper surface of the fin FA, the side surface of the fin FA, and the upper surface of the element isolation film EI are exposed. In addition, the side surface of the insulating film IF4 and the side surface of the control gate electrode CG that are not covered with the memory gate electrode MG are exposed.

Figure 20:
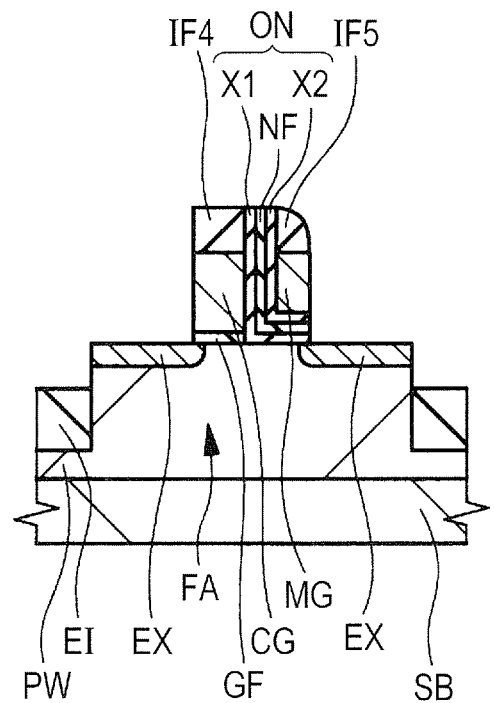
FIG. 20 is a cross-sectional view of the semiconductor device during a manufacturing step following that of FIG. 19.

Next, as shown in FIG. 20, with the insulating films IF4 and IF5, the control gate electrode CG, and the memory gate electrode MG as a mask, ion implantation into the upper surface of the fin FA is performed. By this, a pair of extension regions EX which are n type semiconductor regions are formed in the upper surface of the fin FA. The extension region EX can be formed by implantation of an n type impurity (for example, As (arsenic)).

Figure 21:
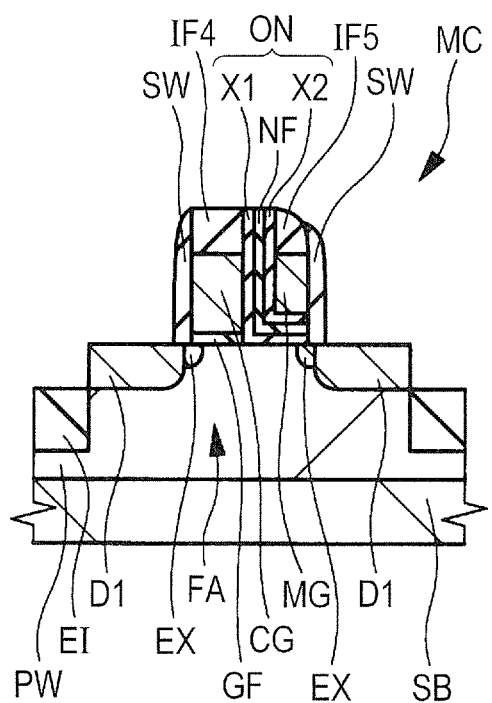
FIG. 21 is a cross-sectional view of the semiconductor device during a manufacturing step following that of FIG. 20.

Next, as shown in FIG. 21, an insulating film is formed on the semiconductor substrate SB, for example, by CVD. This insulating film is mainly made of, for example, a silicon nitride film. The insulating film covers the surface of each of the element isolation film EI, the fin FA, the control gate electrode CG, the memory gate electrode MG, and the insulating films IF4 and IF5.

Then, dry etching is performed to remove a portion of the insulating film and thereby expose the upper surface of each of the element isolation film EI, the fin FA, and the insulating films IF4 and IF5. In this step, a side wall SW made of the insulating film is formed on the side surface of a film stack including the control gate electrode CG, the memory gate electrode MG, and the insulating films IF4 and IF5.

Then, with the insulating films IF4 and IF5, the control gate electrode CG, the memory gate electrode MG, and the side wall SW as a mask, ion implantation into the upper surface of the fin FA is performed. In this step, by implanting an n type impurity (for example, P (phosphorus) or As (arsenic)), a pair of diffusion regions D1, which are n type semiconductor regions, is formed in the upper surface of the fin FA. In the step of forming the diffusion region D1, ion implantation is performed at an impurity concentration higher than that in the ion implantation step performed for forming the extension region EX. Then, in order to diffuse the impurity in the semiconductor substrate SB, thermal treatment is performed for activation. By this treatment, the impurity contained in the diffusion region D1 and the extension region EX is diffused.

Thus, a source-drain region including the diffusion region D1 and the extension region EX is formed. The source-drain region and the control gate electrode CG configure a control transistor, while the source-drain region and the memory gate electrode MG configure a memory transistor. The control transistor and the memory transistor configure a memory cell MC. The control transistor and the memory transistor are each a FINFET having the surface of the fin FA as a channel. The term "surface of the fin FA" embraces the upper surface and the side surface of the fin FA.

Figure 22:
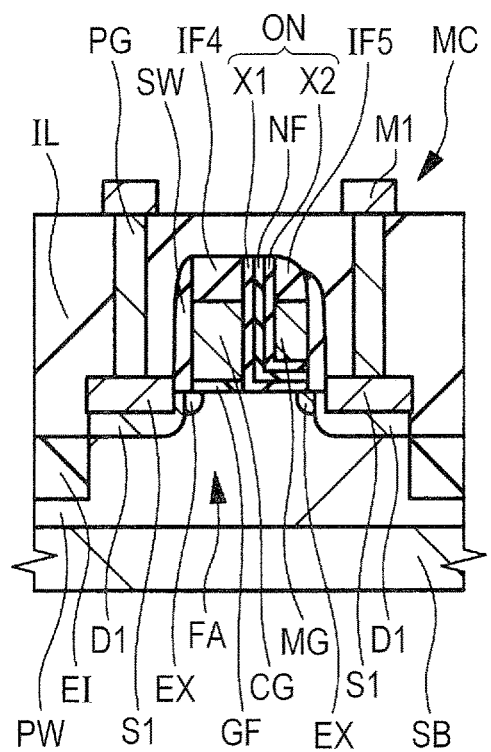
FIG. 22 is a cross-sectional view of the semiconductor device during a manufacturing step following that of FIG. 21.

Next, as shown in FIG. 22, a silicide layer that covers the source-drain region is formed using a known salicide (self align silicide) process. In this step, first, a metal film that covers the fin FA is formed. The metal film is made of a NiPt film deposited, for example, by sputtering. The semiconductor substrate SB is then heat treated to cause a reaction between the surface of the fin FA and the metal film. Thus, a silicide layer S1 made of a NiSi (nickel silicide) film that covers the upper surface and the side surface of the diffusion region D1 is formed.

Next, a liner film (not illustrated) made of, for example, a silicon nitride film and an interlayer insulating film IL made of a silicon oxide film are formed successively on the main surface of the semiconductor substrate SB. The liner film and the interlayer insulating film IL can be formed, for example, by CVD. The interlayer insulating film IL has a thickness greater than the total height of the fin FA on the element isolation film EI and the film stack made of the control gate electrode CG and the insulating film IF4. The upper surface of the interlayer insulating film IL is then planarized using, for example, CMP. In this planarization step, the insulating films IF4 and IF5 are not exposed.

A plurality of contact holes penetrating the interlayer insulating film IL is then formed using photolithography and dry etching. A portion of the upper surface of the silicide layer S1 immediately above the source-drain region is exposed from the bottom portion of the contact holes. In a region not illustrated, the contact hole exposes a portion of the upper surface of each of the control gate electrode CG and the memory gate electrode MG.

A conductive plug PG made mainly of tungsten (W) as a coupling conduction member is then formed in each contact hole. The plug PG has a stacked structure of a barrier conductor film (for example, a titanium film, a titanium nitride film, or a film stack thereof) and a main conductor film (for example, a tungsten film) located on the barrier conductor film.

The plug PG is electrically coupled to each of the source region and the drain region of the memory cell MC via the silicide layer S1.

A wiring M1 is then formed on the interlayer insulating film IL. The wire M1 has a stacked structure of a barrier conductor film (for example, a titanium nitride film, a tantalum film, or a tantalum nitride film) and a main conductor film (a copper film) formed on the barrier conductor film. FIG. 22 shows the barrier conductor film and the main conductor film configuring the wiring M1 as one film in order to simplify the drawing. This also applies to the plug PG. By the above-described steps, the semiconductor device of the present embodiment is substantially completed.

The wiring M1 can be formed, for example, by so-called single damascene process. Described specifically, the wiring M1 can be formed by forming an interlayer insulating film having a wiring trench on the interlayer insulating film IL and then filling the wiring trench with a metal film. The interlayer insulating film on the side of the wiring M1 is not illustrated in this drawing.

<Advantage of Manufacturing Method of Semiconductor Device>

The method of manufacturing the semiconductor device according to the present embodiment can offer advantages similar to those of the semiconductor device described referring to FIGS. 1 to 5.

In this method, in the counter doping step described referring to FIGS. 15 and 16, a semiconductor layer in intrinsic form is used as a portion of the semiconductor film SI3, which will be a memory gate electrode later, on the upper surface of the fin FA. This facilitates formation of a depletion layer in the upper electrode, which is the memory gate electrode MG on the upper surface of the fin FA, during write operation in the completed memory cell MC shown in FIG. 22 and therefore, unbalanced injection of electrons into the ONO film ON in the vicinity of the upper surface of the fin FA can be suppressed. On the other hand, injection of electrons into the ONO film ON that covers the side surface of the fin FA is not hindered even if the upper electrode is made intrinsic in the present embodiment, because the lower electrode, which is a portion of the memory gate electrode MG that covers the side surface of the fin FA keeps an n type conductivity.

This makes it possible to prevent a difference in electron injection distribution from occurring between the ONO film ON that covers the upper surface of the fin FA and the ONO film ON that covers the side surface of the fin FA and thereby inject electrons more uniformly into the whole silicon nitride film NF that covers the surface of the fin FA. As a result, problems such as deterioration in write characteristics and deterioration in endurance can be prevented. The semiconductor device thus obtained can therefore have improved reliability.

In the above-described method of manufacturing a semiconductor device according to the present embodiment, formation of the n type semiconductor film SI3 (refer to FIG. 14) is followed by implantation of a p type impurity into the semiconductor film SI3 on the upper surface of the fin FA. It is also possible to form a semiconductor film in intrinsic form and therefore having almost no impurity introduced therein and then implant an n type impurity by ion implantation from an oblique direction with respect to the upper surface of the semiconductor film. In other words, when a semiconductor film in intrinsic form having a shape similar to that of the semiconductor film SI3 shown in FIG. 14 is formed, ion may be implanted into the semiconductor film, for example, at an oblique angle between a direction perpendicular to the main surface of the semiconductor substrate SB and the direction Y (refer to FIG. 1).

By this ion implantation, an n type impurity is introduced into a semiconductor film adjacent to the side surface of the fin FA as into the semiconductor film SI3 shown in FIG. 16. A memory gate electrode having an upper electrode whose n type impurity concentration is lower than that of the lower electrode can be realized as in the semiconductor device of the present embodiment by adjusting injection energy to be relatively large, implanting an n type impurity at a relatively deep position of the semiconductor film, and thereby forming a memory gate electrode comprised of the semiconductor film. Advantages similar to those obtained in the semiconductor device and manufacturing method thereof described referring to FIGS. 1 to 22 can therefore be obtained.

The counter doping described referring to FIGS. 15 and 16 may be performed after the step described referring to FIG. 13 but before the etch back step described referring to FIG. 14.

In the above-described present embodiment, the memory gate electrode is made partially intrinsic, but the upper portion of the memory gate electrode is not always required to be made intrinsic. Even if the upper portion of the memory gate electrode is a lightly-doped n type semiconductor layer, the advantages of the present embodiment can be obtained by making the n type impurity concentration of the upper portion lower than that of the lower portion.

<Modification Example>

In the manufacturing steps of the semiconductor device described referring to FIGS. 6 to 22, counter doping is performed to provide a difference in n type impurity concentration between the upper portion and lower portion in the semiconductor film SI3 as described referring to FIGS. 15 and 16. It may also be possible to form a memory gate electrode having a stacked structure of two layers and provide a difference in n type impurity concentration between a lower-side layer and an upper-side layer.

A method of manufacturing a semiconductor device of a modification example of the present embodiment will hereinafter be described referring to FIGS. 23 to 27. FIGS. 23 to 27 are cross-sectional views of the semiconductor device of the modification example of the present embodiment during its manufacturing steps. FIG. 26 shows, similar to FIG. 16, a cross-section of the semiconductor device shown in FIG. 25 along the direction Y.

Figure 23:
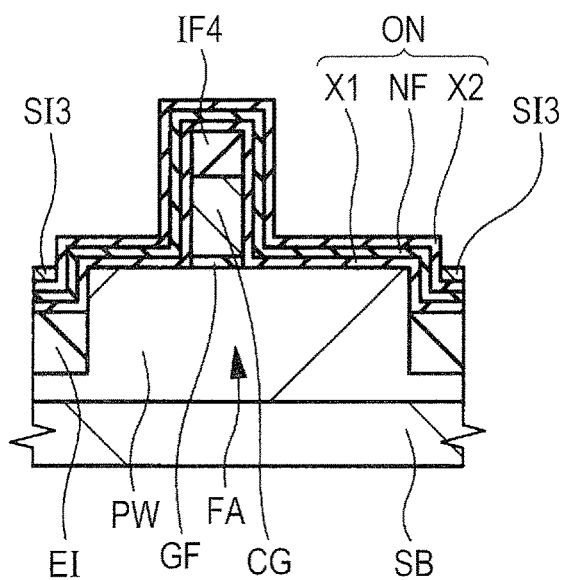
FIG. 23 is a cross-sectional view of a semiconductor device of a modification example of First Embodiment of the invention during a manufacturing step of the device.

In the present modification example, after steps similar to those described referring to FIGS. 6 to 13, the upper surface of the semiconductor film SI3 is etched back as shown in FIG. 23. In this step, the etch back time is made longer than that of the etch back step described referring to FIG. 14 to increase the retreat amount of the upper surface of the semiconductor film SI3. By this etch back, the upper surface of the semiconductor film SI3 which is an n type semiconductor layer becomes lower than the upper surface of the ONO film ON that covers the upper surface of the fin FA. This means that the upper surface of the ONO film ON that covers the upper surface of the fin FA is exposed from the semiconductor film SI3. The semiconductor film SI3 however covers the side surface of the fin FA and the upper surface of the element isolation film EI. By this etch back, the position of the upper surface of the semiconductor film SI3 retreats to, for example, a position substantially equal to the position of the upper surface of the fin FA.

Figure 24:
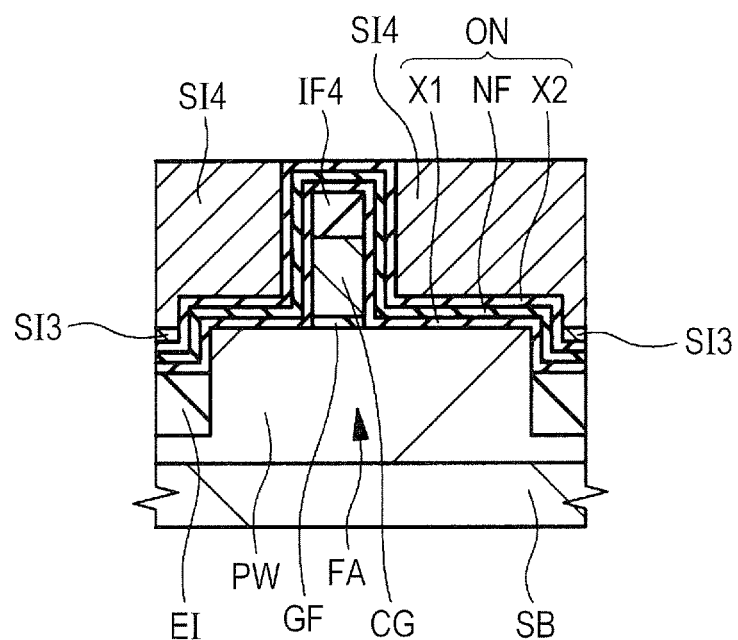
FIG. 24 is a cross-sectional view of the semiconductor device during a manufacturing step following that of FIG. 23.

Next, as shown in FIG. 24, a semiconductor film SI4 is formed on the semiconductor substrate SB, for example, by CVD. The semiconductor film SI4 is made of, for example, a polysilicon film and has a thickness greater than the height of a film stack including the control gate electrode CG and the insulating film IF4. Then, the upper surface of the semiconductor film SI4 is polished using CMP to expose the upper surface of the ONO film ON on the insulating film IF4.

The semiconductor film SI4 is made of a semiconductor layer in intrinsic form having less than $1\times10^{18}$ atms/cm$^3$ of an n type impurity (for example, P (phosphorus) or As (arsenic)) which is contained at the time of film formation. This means that the semiconductor film SI4 has an n type impurity concentration lower than that of the semiconductor film SI3 contiguous to the lower surface of the semiconductor film SI4. The semiconductor film SI4 is in contact with the upper surface of the ONO film ON that covers the upper surface of the fin FA.

Figure 25:
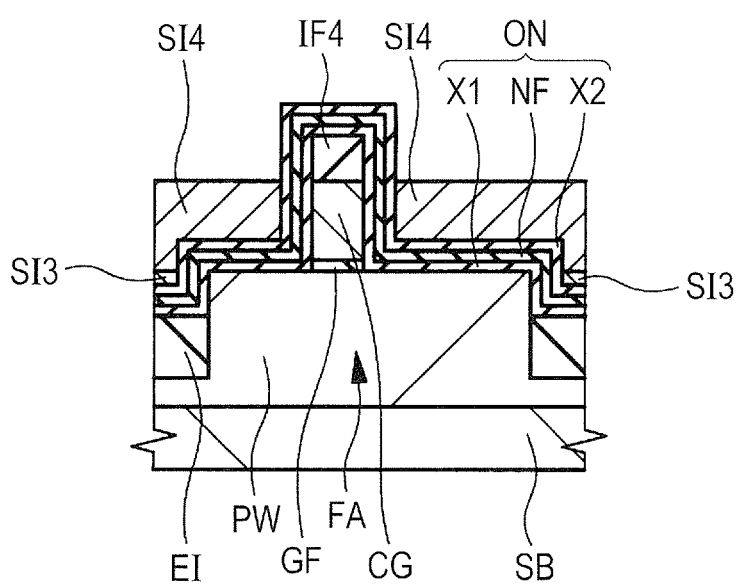
FIG. 25 is a cross-sectional view of the semiconductor device during a manufacturing step following that of FIG. 24.
Figure 26:
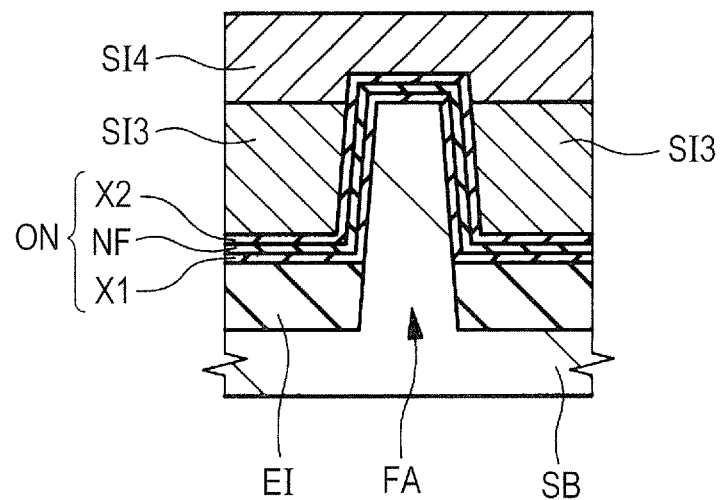
FIG. 26 is a cross-sectional view of the semiconductor device shown in FIG. 25 along the direction Y.

Next, as shown in FIGS. 25 and 26, an etch back step similar to that described referring to FIG. 14 is performed. By this step, the height of the upper surface of the semiconductor film SI4 retreats to a height equal to the upper surface of the control gate electrode CG. As shown in FIG. 26, the upper surface of the fin FA is covered with the semiconductor film SI4 and the side surface of the fin FA is covered with the semiconductor film SI3.

Figure 27:
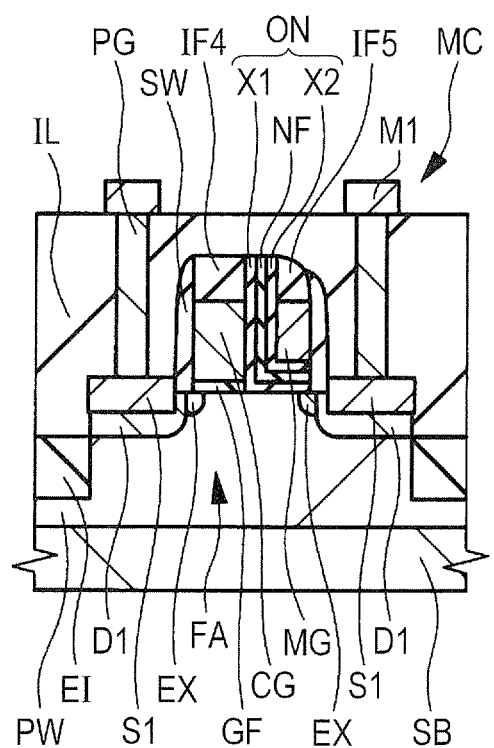
FIG. 27 is a cross-sectional view of the semiconductor device during a manufacturing step following that of FIG. 26.

Next, as shown in FIG. 27, steps similar to those described referring to FIGS. 17 to 22 are performed to substantially complete the semiconductor device of the present modification example. The memory gate electrode MG configuring the completed memory cell MC is comprised of the semiconductor film SI3 made of an n type semiconductor and the semiconductor film SI4 in intrinsic form stacked on the semiconductor film SI3. FIG. 27 however does not show the semiconductor film SI3. As shown in FIG. 26, the semiconductor film SI3 fills a space between the fins FA adjacent to each other in the direction Y at a position of the memory gate electrode MG (refer to FIG. 27), which extends in the direction Y, lower than the upper surface of the fin FA.

In the present modification example, the memory gate electrode MG shown in FIG. 27 is comprised of a stacked structure of the semiconductor films SI3 and SI4. Here, the upper surface of the fin FA is covered with the semiconductor film SI4 in intrinsic form and the side surface of the fin FA is covered with the n type semiconductor film SI3. This makes it possible to prevent electrons from being injected locally into the ONO film ON in the vicinity of the upper surface of the fin FA at the time of write operation of the memory cell MC so that advantages similar to those obtained from the semiconductor device and manufacturing steps thereof described referring to FIGS. 1 to 22 can be obtained.

(Second Embodiment)

Figure 28:
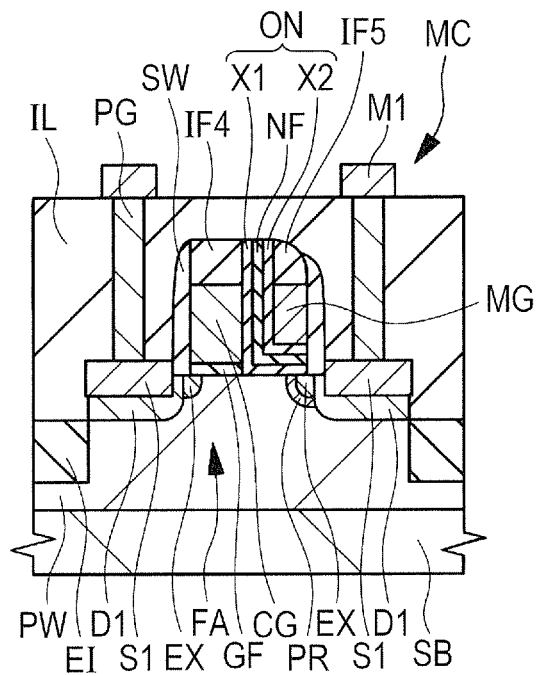
FIG. 28 is a cross-sectional view showing a semiconductor device of Second Embodiment of the invention.
Figure 29:
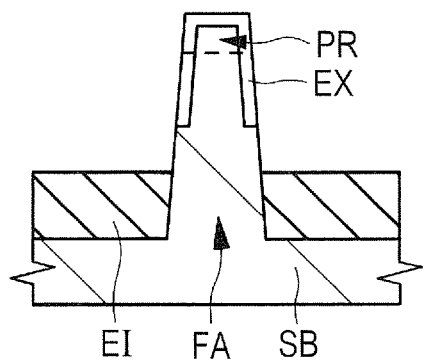
FIG. 29 is a cross-sectional view of the semiconductor device shown in FIG. 28 along the direction Y.

In First Embodiment, attention was paid to the problems attributable to the operation at the time of writing information (data) to a memory cell and a semiconductor device capable of overcoming the problems and a manufacturing method thereof were described. A semiconductor device of Second Embodiment and a manufacturing method thereof will hereinafter be described referring to FIGS. 28 and 29. FIGS. 28 and 29 are cross-sectional views showing the semiconductor device of the present embodiment. FIG. 29 shows a cross-section including an extension region EX and a semiconductor region PR shown in FIG. 28 and running along the gate width direction (direction Y). It is to be noted that FIG. 29 does not illustrate a structure on the extension region EX, that is, an ONO film, a memory gate electrode, a side wall, and an interlayer insulating film.

The semiconductor device of the present embodiment is different from that of First Embodiment in that the memory gate electrode is made only of an n type semiconductor layer and that the fin having a source region therein has, in the upper surface thereof, a P (phosphorus)-doped semiconductor region.

As shown in FIG. 28, the memory cell MC of the present embodiment has a constitution almost similar to that of the memory cell of First Embodiment, but the fin FA has, in the upper surface thereof, an n type semiconductor region PR having P (phosphorus) introduced therein as an n type impurity. The semiconductor region PR is in the upper surface of the fin FA on the side of the source region comprised of the extension region EX and the diffusion region D1 on the side of the memory gate electrode MG.

As shown in FIGS. 28 and 29, the formation depth of the semiconductor region PR from the upper surface of the fin FA is greater than that of the extension region EX from the upper surface of the fin FA. The extension region EX is on the upper surface and the side surface of the fin FA and has a portion along the upper surface of the fin FA and a portion along the side surface of the fin FA. The semiconductor region PR is, on the other hand, made only of a portion along the upper surface of the fin FA. This means that the extension region EX contains arsenic (As) implanted into the upper surface and the side surface of the fin FA, while the semiconductor layer PR contains phosphorus (P) implanted only into the upper surface of the fin FA. In FIG. 29, the lower surface of the semiconductor region PR formed in the upper surface of the fin FA is shown by a dotted line.

The term "formation depth" means, when a semiconductor region is formed in a layer from a predetermined surface of the layer, the width of the semiconductor region in a direction perpendicular to the surface. As shown in FIG. 29, when attention is paid only to the semiconductor regions formed in the upper surface of the fin FA, the formation depth of the extension region EX is smaller than that of the semiconductor region PR. It is inappropriate to compare the formation depth of the semiconductor regions by comparing the formation regions of the semiconductor region PR and the extension region EX in the vicinity of the side surface of the fin FA because on the side surface of the fin FA, the end portion of the semiconductor region PR formed in the upper surface of the fin FA is only exposed.

The formation depth of the semiconductor region PR formed in the upper surface of the fin FA is deeper than that of the extension region EX formed in the upper surface of the fin FA, but on the side surface of the fin FA, the lower end of the semiconductor region PR is located above the lower end of the extension region EX.

The semiconductor region PR formed here has a depth greater than that of the extension region EX, but the semiconductor region PR has a depth smaller than that of the extension region EX. In the present embodiment, as shown in FIG. 28, in the upper surface of the fin FA, the semiconductor region PR covers the end portion of the extension region EX and is formed on the side closer to the channel region of the memory transistor than the extension region EX is. This means that the semiconductor region PR is only required to be adjacent to the end portion of the extension region EX and formed closer to the upper surface of the fin FA immediately below the memory gate electrode MG than the extension region EX is. The formation depth of the semiconductor region PR may therefore be either smaller or greater than the formation depth of the extension region EX.

In the upper surface of the fin FA, the n type impurity (As (arsenic)) concentration of the extension region EX is, for example, $1\times10^{15}$ atms/cm$^2$. On the other hand, the n type impurity (P (phosphorus) concentration of the semiconductor region PR is, for example, from $1\times10^{13}$ to $1\times10^{14}$ atms/cm$^2$. This means that the n type impurity concentration is lower in the semiconductor region PR than in the extension region EX.

Here, As (arsenic)) is used as the impurity configuring the extension region EX because As (arsenic) is an impurity which hardly diffuses in the semiconductor substrate SB and is suited for the formation of the extension region EX whose formation depth is smaller than that of the diffusion region D1. On the other hand, P (phosphorus) is used as the impurity configuring the semiconductor region PR because P (phosphorus) is an impurity which diffuses in the semiconductor substrate SB easier than As (arsenic) and in the ion implantation step and the thermal diffusion step subsequent thereto, is suited for the formation of the semiconductor region PR closer to the channel region than the extension region EX is.

The semiconductor device of the present embodiment carries out BTBT erase in the erase operation of the memory cell MC. In other words, as described referring to the column A of the table of FIG. 32, hot hole erase is performed by injecting holes into the silicon nitride film NF from the fin FA (semiconductor substrate SB).

Such a semiconductor device can be achieved by introducing P (phosphorus) into the upper surface of the fin FA, for example, by ion implantation at any time, during manufacturing steps described referring to FIGS. 6 to 22, after the step of forming the memory gate electrode MG described referring to FIG. 19 and before the step of forming the side wall SW described referring to FIG. 21 and thereby forming the semiconductor region PR. In short, the semiconductor region PR can be formed before or after the step of forming the extension region EX. The steps described referring to FIGS. 15 and 16 are not always necessary.

The advantage of the present embodiment will hereinafter be described.

When hot hole erase is performed by injecting holes from the fin FA (semiconductor substrate SB) into the silicon nitride film NF by BTBT, an electric field concentration occurs at the upper end of the fin FA as in that at the time of write operation described above in First Embodiment and holes are therefore injected intensively into the ONO film ON in the vicinity of the upper surface of the fin FA. This means that there occurs variation in injection distribution of holes at the erase time between the ONO film ON that covers the upper surface of the fin FA and the ONO film ON that covers the side surface of the fin FA. This causes deterioration in erase characteristics.

This problem cannot be overcome even by making a portion of the memory gate electrode MG intrinsic as in First Embodiment, because due to application of a negative voltage to the memory gate electrode MG at the time of erase operation by BTBT, even control of the concentration of the memory gate electrode MG does not cause depletion in the memory gate electrode MG and the electric field of the fin FA cannot therefore be relaxed.

In the present embodiment, the electric field around the source region can be relaxed and the electric field at the upper end of the fin FA at the time of erase operation by BTBT can be relaxed by forming the semiconductor region PR having an impurity concentration lower than that of the extension region EX in a region which is in the upper surface of the fin FA and adjacent to the extension region EX configuring the source region. This makes it possible to reduce the amount of holes to be generated in the upper surface of the fin FA and injected into the silicon nitride film NF at the time of erase operation. Accordingly, local hole injection into the ONO film ON in the vicinity of the upper surface of the fin FA at the erase time can be prevented and the injection distribution of holes into the ONO film ON that covers the upper surface and the side surface of the fin FA can be made uniform. This leads to prevention of deterioration in erase characteristics. In short, the semiconductor device thus obtained can have improved reliability.

(Third Embodiment)

Figure 30:
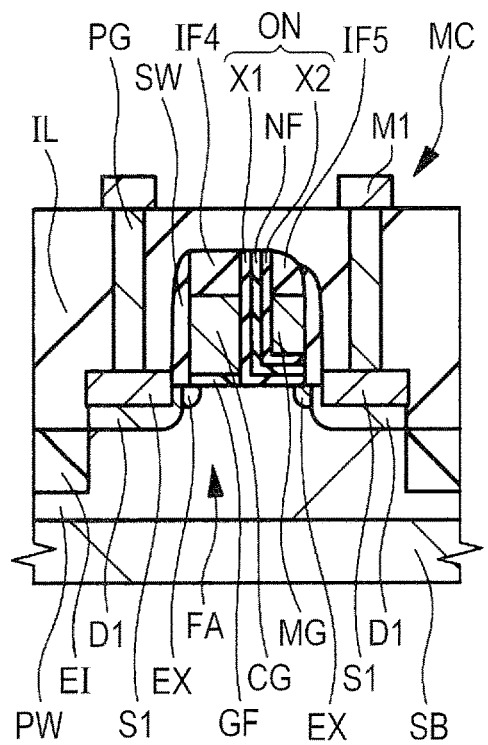
FIG. 30 is a cross-sectional view showing a semiconductor device of Third Embodiment of the invention.
Figure 31:
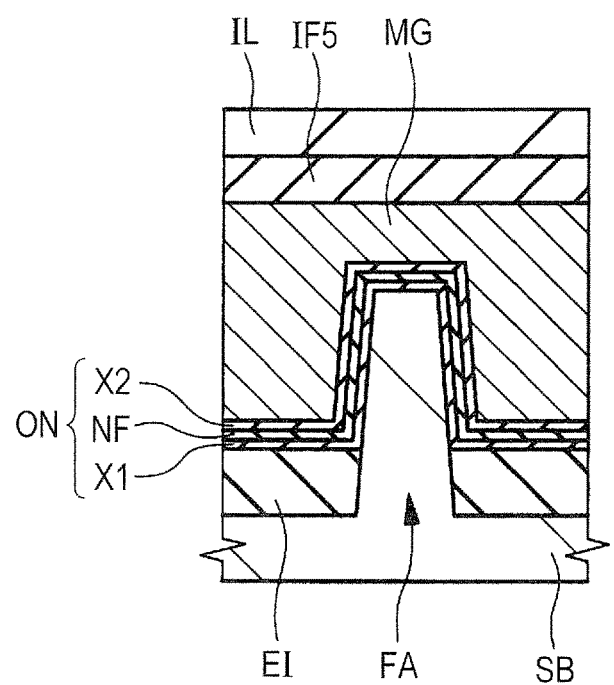
FIG. 31 is a cross-sectional view of the semiconductor device shown in FIG. 30 along the direction Y.

A semiconductor device of Third Embodiment and a manufacturing method thereof will hereinafter be described referring to FIGS. 30 and 31. FIGS. 30 and 31 are cross-sectional views showing the semiconductor device of the present embodiment. FIG. 30, similar to FIG. 4, shows a cross-section of a memory cell along the direction X. FIG. 31, similar to FIG. 5, shows a cross-section including a memory gate electrode and shows a cross-section of the semiconductor device shown in FIG. 30 along the direction Y.

The semiconductor device of the present embodiment has a structure almost similar to that of First Embodiment, but the memory gate electrode of the present embodiment is partially different in impurity concentration distribution from the memory gate electrode of First Embodiment.

In the present embodiment, as shown in FIGS. 30 and 31, the memory gate electrode MG is similar to that of First Embodiment in that the memory gate electrode MG in the vicinity of the upper end of the fin FA is made intrinsic. On the other hand, it is only necessary that the n type impurity concentration of the corner portion of the memory gate electrode MG in the vicinity of a boundary between the upper surface of the element isolation film EI and the side surface of the fin FA (which will hereinafter be called "lower end of the side surface of the fin FA") is higher than that of the memory gate electrode MG in the vicinity of the upper end of the fin FA. In other words, the memory gate electrode MG is comprised of a highly-doped region located in the vicinity of the upper surface of the element isolation film EI and having a high impurity concentration and a lightly-doped region located on the highly-doped region and having a low impurity concentration. This means that the memory gate electrode MG that covers the entire side surface of the fin FA is not always an n type semiconductor layer and in this point, the present embodiment is different from First Embodiment.

The lightly-doped region covers the upper end of the fin FA. This means that at least the impurity concentration of a region of the memory gate electrode MG adjacent to the vicinity of the lower end of the side surface of the fin FA (highly-doped region) via the ONO film ON is higher than that of a region of the memory gate electrode MG contiguous to the upper surface of the ONO film ON that covers the upper surface of the fin FA (lightly-doped region). In other words, the n type impurity concentration at the lower end of the memory gate electrode MG that covers the side surface of the fin FA is higher than that of the memory gate electrode MG on the upper surface of the fin FA.

Such a memory cell MC can be achieved, for example, by locating a boundary between the lightly-doped region and the heavily-doped region at a position equal to any position of the side surface of the fin FA on the element isolation film EI. Such a memory cell MC can also be achieved, for example, by forming a memory gate electrode MG having a concentration distribution in which an n type impurity concentration shows a gradual increase from the upper surface to the lower surface.

The semiconductor device of the present embodiment uses SSI for writing in the write operation of the memory cell MC and uses FN for erasing in the erase operation of the memory cell MC. As described referring to the column B of the table of FIG. 32, erase at the time of erasing data is performed by applying a positive voltage to the memory gate electrode MG and thereby injecting holes from the memory gate electrode MG into the silicon nitride film NF.

In the steps of manufacturing the semiconductor device of the present embodiment, for example, steps similar to those described referring to FIGS. 6 to 14 are performed first. Then, counter doping as described referring to FIGS. 15 and 16 is performed. In this counter doping, however, a p type impurity (for example, B (boron) or $BF_2$ (boron fluoride)) may be injected at a position deeper than that of First Embodiment. This is because the present embodiment is different from First Embodiment in which the entire memory gate electrode that covers the side surface of the fin FA is an n type semiconductor layer in order to prevent a decrease in the electron injection amount into the ONO film ON that covers the side surface of the fin FA in consideration of the write operation of the memory cell.

By this counter doping, the semiconductor film SI3 in the vicinity of the upper end of the fin FA becomes a semiconductor layer in intrinsic form, but the n type conductivity of the semiconductor film SI3 in the vicinity of the upper surface of the element isolation film EI is kept as is because the p type impurity is hardly introduced into the semiconductor film SI3 in the vicinity of the upper surface of the element isolation film EI.

The steps described referring to FIGS. 17 to 22 are then performed to substantially complete the semiconductor device of the present embodiment. The counter doping described referring to FIGS. 15 and 16 may be performed after the step described referring to FIG. 13 and before the etch back step described referring to FIG. 14.

Figure 34:
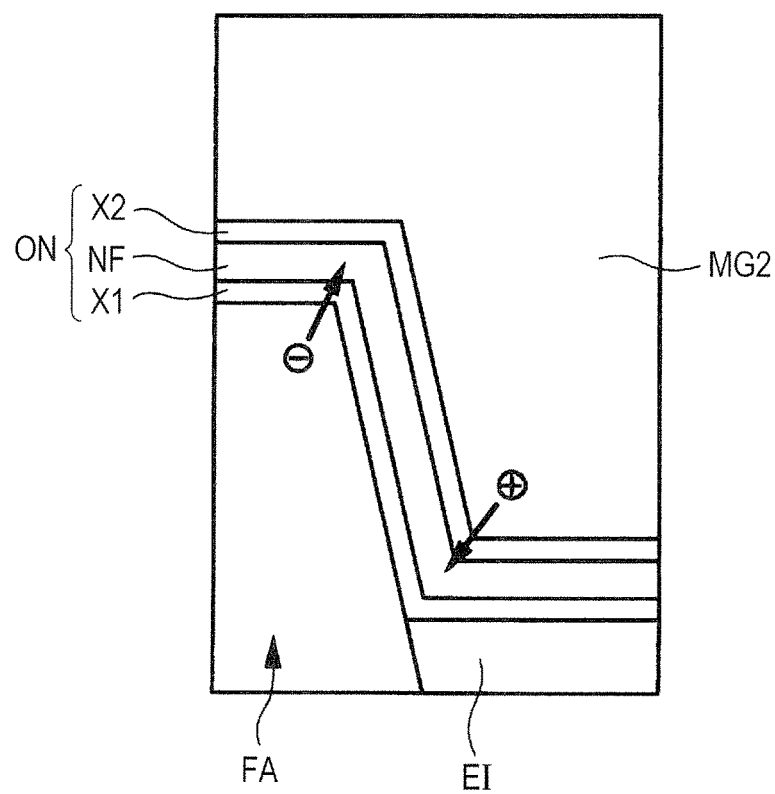
FIG. 34 is a cross-sectional view showing a semiconductor device of another Comparative Example.

The advantage of the present embodiment will hereinafter be described using Comparative Example shown in FIG. 34. FIG. 34 is a cross-sectional view showing a semiconductor device of Comparative Example.

The semiconductor device of Comparative Example shown in FIG. 34 is, similar to the semiconductor device of the present embodiment, a memory cell that uses SSI for writing and uses FN for erasing and has a structure similar to that of the semiconductor device of the present embodiment except that the entire memory gate electrode MG2 has a uniform n type impurity concentration. FIG. 34 shows a cross-section taken along the gate width direction (direction Y) of a memory gate electrode MG2 and including the memory gate electrode MG2 and a fin FA. FIG. 34 omits the illustration of hatching to facilitate understanding of this drawing.

When write operation is performed in the memory cell of Comparative Example, electric field concentration occurs at the upper end of the fin FA and therefore, electrons are injected heavily into the silicon nitride film NF in the vicinity of the upper surface of the fin FA. At the time of erase operation of the memory cell of Comparative example, on the other hand, a high positive voltage is applied to the memory gate electrode MG2, electric field concentration occurs at the corner portion of the memory gate electrode MG2 in the vicinity of the lower end of the side surface of the fin FA, and holes are generated easily at the corner portion. Holes are therefore heavily injected into the silicon nitride film NF in the vicinity of the lower end of the side surface of the fin FA. At the time of writing and at the time of erasing, there occurs a misalignment (mismatch) between an electron injection position and a hole injection position. Thus, erase operation is not performed normally.

In the present embodiment, on the other hand, the number of holes generated in the memory gate electrode MG in the vicinity of the lower end of the side surface of the fin FA can be reduced at the time of erase operation by increasing the n type impurity concentration in the memory gate electrode MG in the vicinity of the lower end of the side surface of the fin FA. The n type impurity concentration in the memory gate electrode MG in the vicinity of the upper end of the fin FA is lower than that in the memory gate electrode MG in the vicinity of the lower end of the side surface of the fin FA so that due to depletion in the memory gate electrode MG in the vicinity of the upper end of the fin FA at the time of erase operation, holes are generated and these holes are injected into the silicon nitride film NF.

Thus, by reducing the injection amount of holes into the silicon nitride film NF in the vicinity of the lower end of the side surface of the fin FA, a hole injection distribution in the entire ONO film ON that covers the upper surface and the side surface of the fin FA at the time of erase can be made uniform. This makes it possible to prevent misalignment between the electron injection position and the hole injection position at the write time and erase time of the memory cell MC and therefore to prevent abnormal erase operation. In short, the semiconductor device thus obtained can have improved reliability.

In the above-described present embodiment, a portion of the memory gate electrode is made intrinsic but it is not always necessary to make an upper portion of the memory gate electrode intrinsic. Even if the upper portion of the memory gate electrode is a lightly-doped n type semiconductor layer, the advantage of the present embodiment can be achieved by making the n type impurity concentration of the upper portion lower than the lower portion.

The invention made by the present inventors has been described above specifically based on some embodiments. It is needless to say that the invention is not limited by these embodiments but can be changed variously without departing from the gist of the invention.

For example, First to Third Embodiments may be used in any combination. The modification example (refer to FIGS. 23 to 27) of First Embodiment may be applied to Third Embodiment.

What is claimed is:

1. A semiconductor device, comprising:
a semiconductor substrate;
a protruding portion which is a portion of the semiconductor substrate, protrudes from an upper surface of the semiconductor substrate, and extends in a first direction along the upper surface of the semiconductor substrate;
a first gate electrode formed over the protruding portion via a first insulating film and extending in a second direction orthogonal to the first direction;
a second gate electrode formed over the protruding portion via a second insulating film including a charge accumulation portion, adjacent to one of side surfaces of the first gate electrode via the second insulating film, and extending in the second direction; and
an n type source region and an n type drain region formed in an upper surface of the protruding portion so as to sandwich, in the first direction, a part of the protruding portion immediately below a pattern having the first gate electrode and the second gate electrode,
wherein the second gate electrode has an upper portion extending across the upper surface of the protruding portion and a lower portion extending along both side surfaces of the protruding portion, wherein the first gate electrode, the second gate electrode, the source region, and the drain region constitute parts of a nonvolatile memory element, and wherein an n type impurity concentration of the upper portion of the second gate electrode is lower than an n type impurity concentration of the lower portion of the second gate electrode.

2. The semiconductor device according to claim 1, wherein the source region has a portion adjacent to the second gate electrode in plan view and comprises:

an n type first semiconductor region;

an n type second semiconductor region having an n type impurity concentration lower than an n type impurity concentration of the first semiconductor region, the n type second semiconductor region being located closer than the first semiconductor region to a part of the protruding portion immediately below the second gate electrode, and being formed along the upper surface and along the side surfaces of the protruding portion; and an n type third semiconductor region having an n type impurity concentration lower than the n type impurity concentration of the second semiconductor region, the n type third semiconductor region being located closer than the second semiconductor region to a channel region between the source and drain regions, and being formed along the upper surface of the protruding portion.

3. The semiconductor device according to claim 2, wherein the second semiconductor region has arsenic introduced therein and the third semiconductor region has phosphorus introduced therein.

4. The semiconductor device according to claim 2, wherein in erase operation of the nonvolatile memory element, data is erased by band-to-band tunneling (BTBT).

5. The semiconductor device according to claim 1, wherein in erase operation of the nonvolatile memory element, data is erased by Fowler Nordheim (FN) tunneling.

6. The semiconductor device according to claim 1, wherein a portion of the second gate electrode adjacent to the protruding portion in a direction along the upper surface of the semiconductor substrate has an n type conductivity and a portion of the second gate electrode over the protruding portion has an intrinsic form.

7. The semiconductor device according to claim 1, wherein the number, per volume, of p type impurities contained in a portion of the second gate electrode adjacent to the protruding portion in a direction along the upper surface of the semiconductor substrate is smaller than the number, per volume, of p type impurities contained in a portion of the second gate electrode over the protruding portion.

8. The semiconductor device according to claim 1, wherein the second gate electrode comprises:

a first semiconductor layer that covers parts of the side surfaces of the protruding portion and formed below the upper surface of the protruding portion; and a second semiconductor layer that is formed over the first semiconductor layer and extends across the upper surface of the protruding portion, wherein the second semiconductor layer has an n type impurity concentration lower than an n type impurity concentration of the first semiconductor layer.

9. The semiconductor device according to claim 1, wherein in write operation of the nonvolatile memory element, data is written by source side injection (SSI).

10. The semiconductor device according to claim 1, wherein the n type impurity concentration of the second gate electrode gradually increases from the upper surface of the second gate electrode to a lowermost surface of the second gate electrode.

11. The semiconductor device according to claim 1, wherein an n type impurity concentration at a lower end of the lower portion of the second gate electrode is higher than the n type impurity concentration of a lower end of the upper portion of the second gate electrode.

12. A semiconductor device, comprising:

a semiconductor substrate;

a protruding portion which is a portion of the semiconductor substrate, protrudes from an upper surface of the semiconductor substrate, and extends in a first direction along the upper surface of the semiconductor substrate;

a first gate electrode formed over an upper surface of the protruding portion via a first insulating film and extending in a second direction orthogonal to the first direction;

a second gate electrode formed over the upper surface of the protruding portion and a side surface of the protruding portion via a second insulating film including a charge accumulation portion, the second gate electrode being adjacent to one of side surfaces of the first gate electrode via the second insulating film, and extending in the second direction; and an n type source region and an n type drain region formed in the upper surface of the protruding portion so as to sandwich, in the first direction, a part of the protruding portion immediately below a pattern having the first gate electrode and the second gate electrode, wherein the first gate electrode, the second gate electrode, the source region, and the drain region constitute parts of a nonvolatile memory element, and wherein the source region has a portion adjacent to the second gate electrode in plan view and comprises:

an n type first semiconductor region;

an n type second semiconductor region having an n type impurity concentration lower than an n type impurity concentration of the first semiconductor region, the n type second semiconductor region being located closer than the first semiconductor region to a part of the protruding portion immediately below the second gate electrode, and being formed along the upper surface and along the side surface of the protruding portion; and an n type third semiconductor region having an n type impurity concentration lower than an n type impurity concentration of the second semiconductor region, the n type third semiconductor region being located closer than the second semiconductor region to a channel region between the source and drain regions, and being formed along the upper surface of the protruding portion.

13. The semiconductor device according to claim 12, wherein the second semiconductor region has arsenic introduced therein and the third semiconductor region has phosphorus introduced therein.

14. The semiconductor device according to claim 12, wherein in erase operation of the nonvolatile memory element, data is erased by band-to-band tunneling (BTBT).

15. The semiconductor device according to claim 12,
wherein in the upper surface of the protruding portion, a formation depth of the third semiconductor region is deeper than a formation depth of the second semiconductor region, and
wherein at the side surface of the protruding portion, a lower end of the third semiconductor region is located above a lower end of the second semiconductor region.

* * * * *